(12) United States Patent
Takada et al.

(10) Patent No.: US 6,202,728 B1
(45) Date of Patent: Mar. 20, 2001

(54) ELECTRIC-COMPONENT FEEDER

(75) Inventors: Yukinori Takada, Anjo; Toshikatsu Terashima, Aichi-ken; Mamoru Tsuda, Okazaki; Koichi Asai, Nagoya, all of (JP)

(73) Assignee: Fuji Machine Mfg. Co., Ltd., Aichi-ken (JP)

( * ) Notice: Subject to any disclaimer, the term of this patent is extended or adjusted under 35 U.S.C. 154(b) by 0 days.

(21) Appl. No.: 09/177,118

(22) Filed: Oct. 22, 1998

(30) Foreign Application Priority Data

Oct. 29, 1997 (JP) .................................................. 9-297612

(51) Int. Cl.⁷ ...................................................... B65H 5/28
(52) U.S. Cl. ........................... 156/584; 156/344; 221/25; 221/87; 414/411; 414/416
(58) Field of Search .................................... 156/344, 584; 221/25, 72, 87; 226/8, 139; 414/411, 416

(56) References Cited

U.S. PATENT DOCUMENTS 5,588,614   12/1996   Takada et al. .
5,695,309 * 12/1997   Kondo et al. ..................... 156/584 X

FOREIGN PATENT DOCUMENTS

| 0 789 508 A1 | 8/1997 | (EP) . |
| 0 794 699 A2 | 9/1997 | (EP) . |
| 7-9381 | 1/1995 | (JP) . |
| 8-23190 | 1/1996 | (JP) . |
| 9-237997 | 9/1997 | (JP) . |
| 10-112598 | 4/1998 | (JP) . |

* cited by examiner

*Primary Examiner*—Mark A. Osele
(74) *Attorney, Agent, or Firm*—Oliff & Berridge, PLC

(57) ABSTRACT

An electric-component feeder for feeding a carrier tape carrying electric components at a predetermined component-carry pitch, at a tape-feed pitch equal to a quotient obtained by dividing the component-carry pitch by an integral number, and thereby supplying the electric components, one by one, the feeder including a main frame including a tape guide which guides the carrier tape in a lengthwise direction thereof; a cam which has a cam surface and which is provided on the main frame such that the cam surface is movable relative to the main frame; a cam drive device which is supported by the main frame and which drives the cam and thereby moves the cam surface relative to the main frame; a cam follower which is supported by the main frame and which follows the cam surface while being moved by the cam surface being moved by the cam drive device; and a motion converting device which is supported by the main frame and which converts the motion of the cam follower into the feeding of the carrier tape at the tape-feed pitch along the tape guide of the main frame.

16 Claims, 22 Drawing Sheets

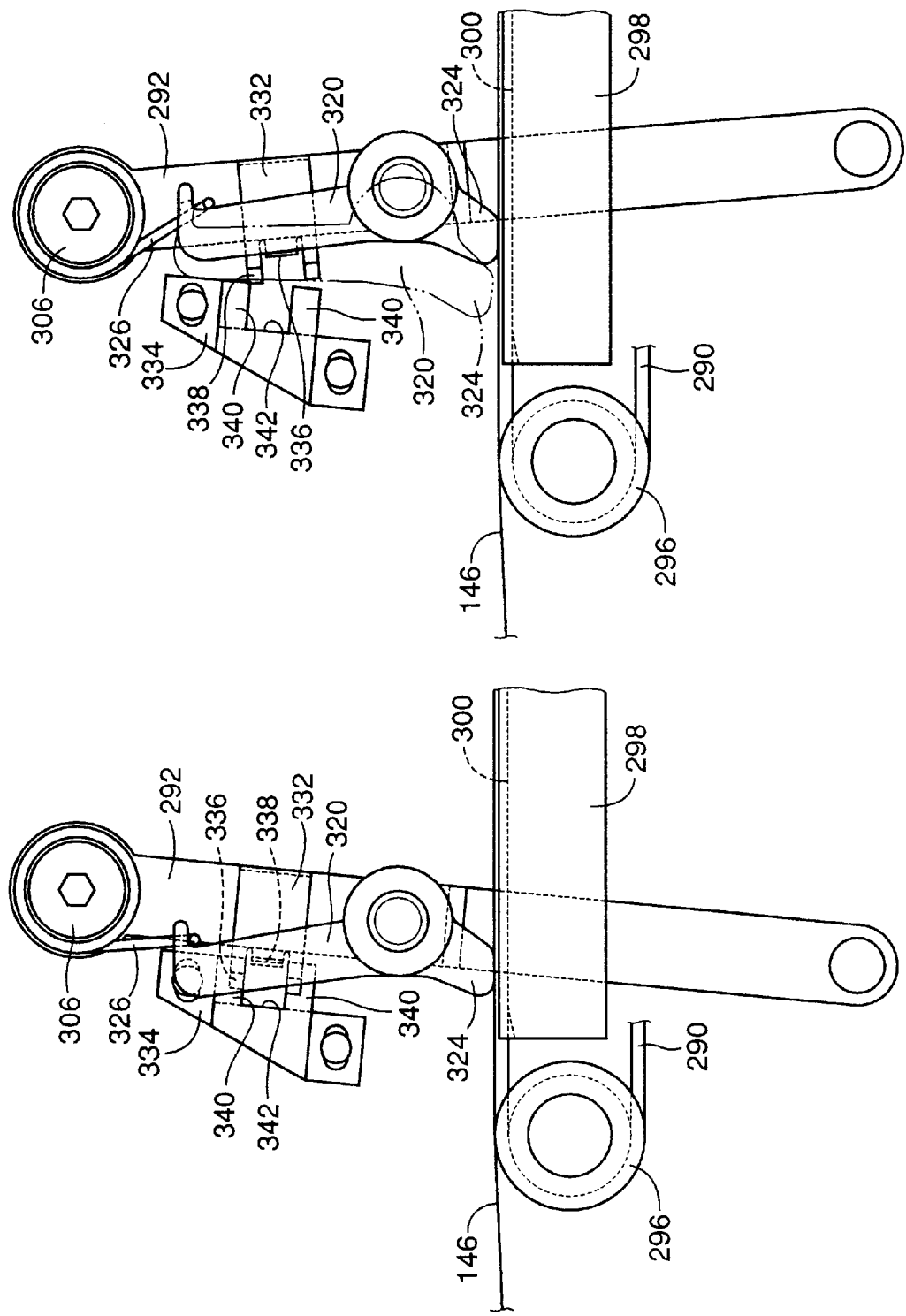

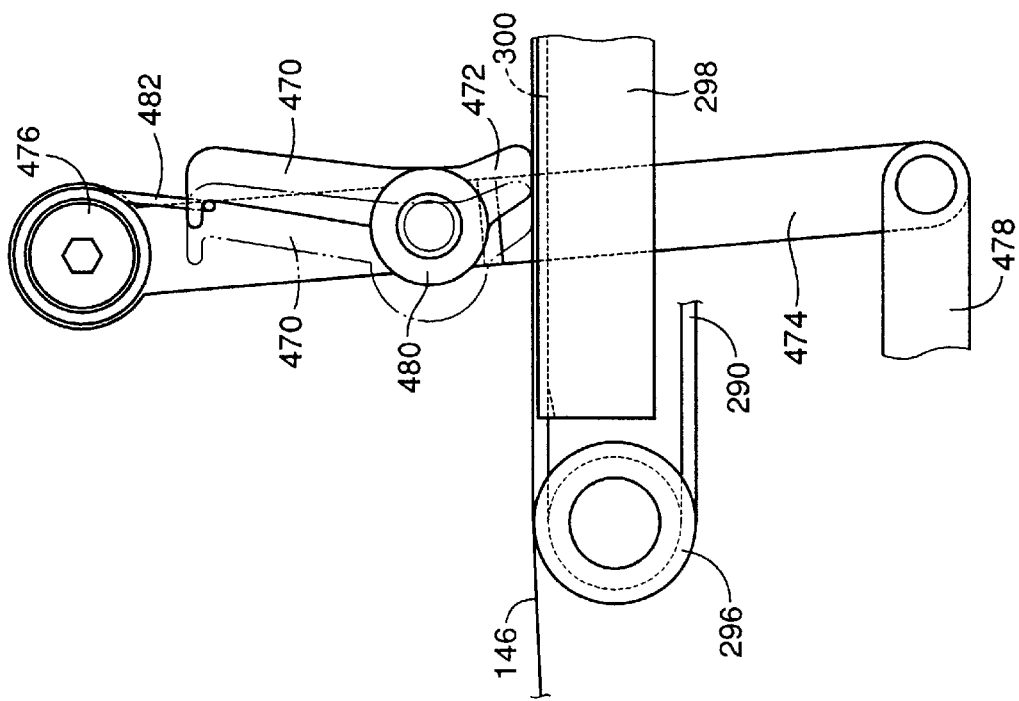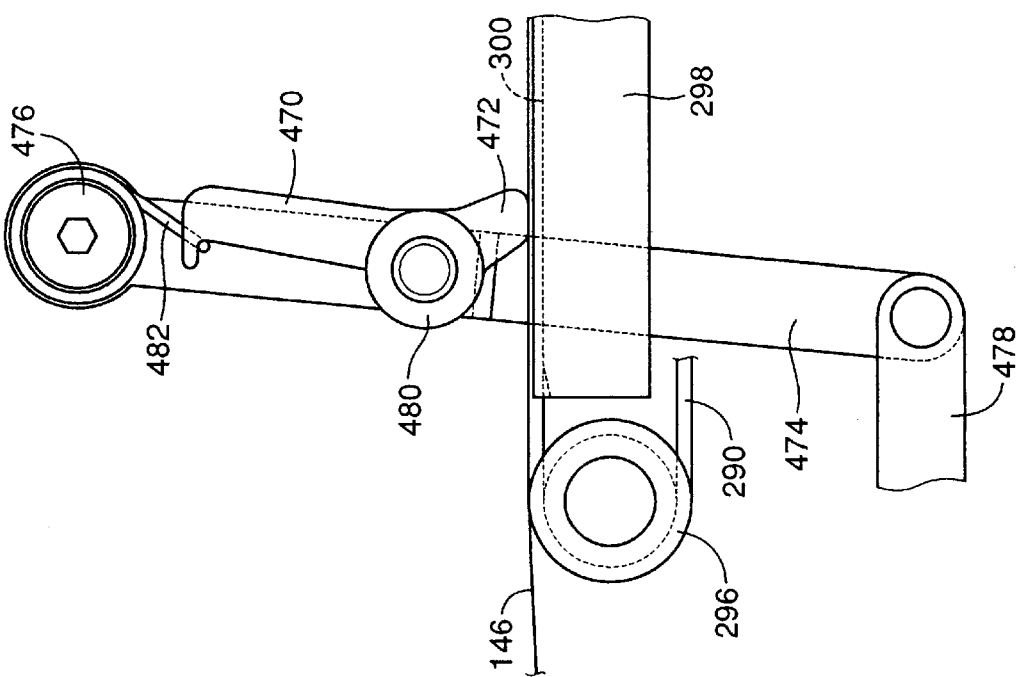

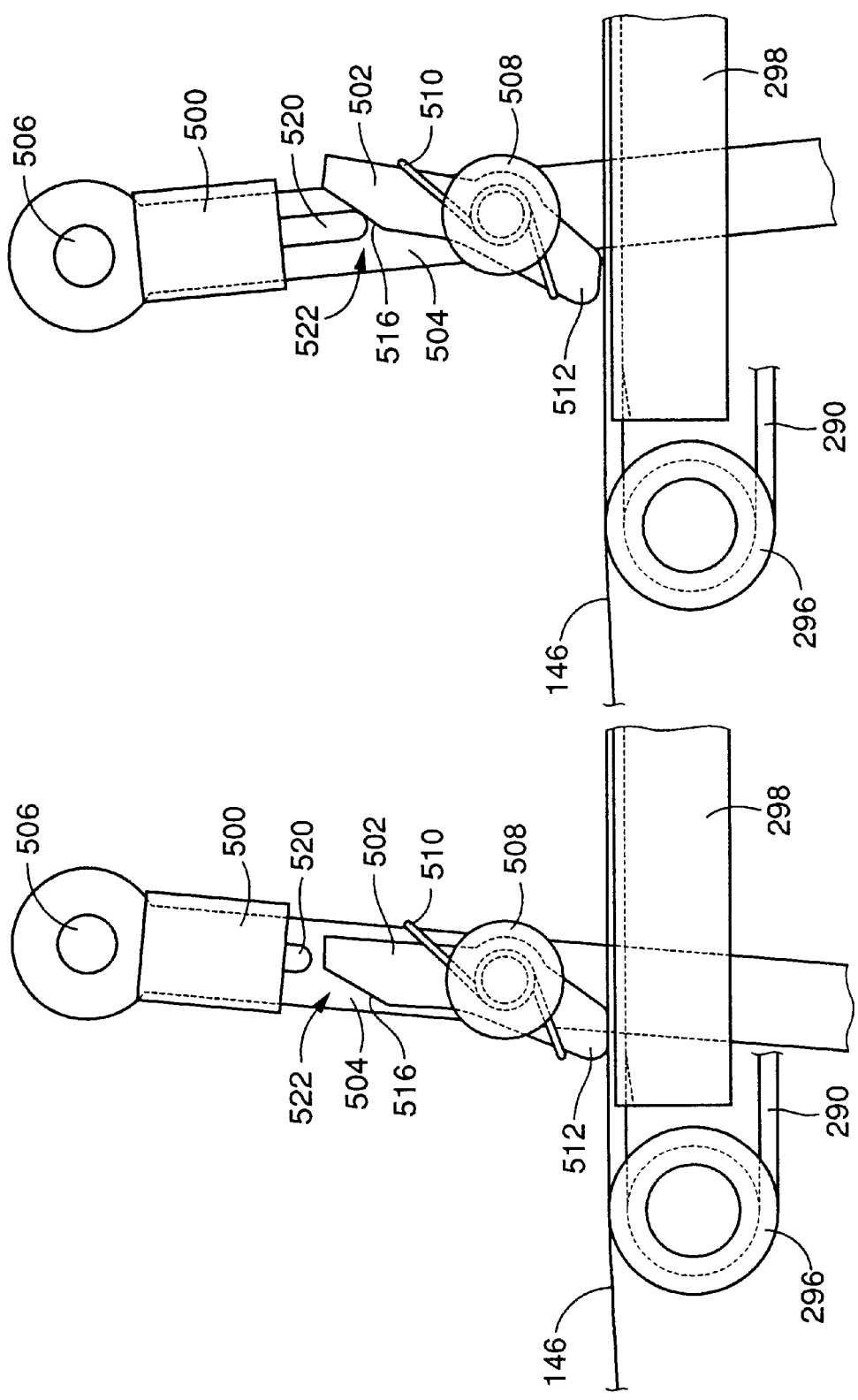

ELECTRIC-COMPONENT FEEDER

BACKGROUND OF THE INVENTION

1. Field of the Art

The present invention generally relates to an electric-component ("EC") feeder which feeds a carrier tape carrying electric components ("ECs") (e.g., electronic components) at a predetermined component-carry pitch, and thereby supplies the ECs, and particularly to the improvements of the feeding of the carrier tape.

2. Related Art Statement

There is known an EC feeder which feeds a carrier tape carrying ECs at a predetermined component-carry pitch, at a tape-feed pitch equal to a quotient obtained by dividing the component-carry pitch by an integral number, and thereby supplies the ECs, one by one, to an EC-taking position. A carrier tape may be fed in various manners. For example, Japanese Patent Application laid open for public inspection under Publication No. 7(1995)-9381 discloses an EC feeder wherein a drive source for feeding a carrier tape is not provided on a main frame of the feeder. This feeder is employed in an EC mounting system so as to supply ECs to an EC mounting device of the EC mounting system. The EC mounting device includes an intermittent-rotation body which is intermittently rotatable about a vertical axis line at a predetermined rotation-angle pitch; and a plurality of EC-suction heads as a plurality of EC-holding heads that are provided on the intermittent-rotation body such that the EC-suction heads are equiangularly spaced from each other about the axis line at a predetermined spacing-angle pitch equal to the rotation-angle pitch. As the intermittent-rotation body is intermittently rotated by a drive device which includes a servomotor as the drive source, the EC-suction heads are sequentially moved to an EC-sucking position, an EC-mounting position, etc. The drive device further includes a drive member which is provided at a position corresponding to the EC-sucking position; a driven member which is provided on the main frame of the EC feeder; and a motion converting device which includes a cam and a cam follower and which transmits the drive force of the above-indicated servomotor to the drive member so as to drive the driven member and thereby feed the EC carrier tape at a predetermined tape-feed pitch.

On the other hand, Japanese Patent Application laid open for public inspection under Publication No. 8(1996)-23190 discloses an EC feeder wherein a drive source is provided on a main frame of the feeder. This feeder employs an air cylinder as the drive source, and feeds a carrier tape by utilizing the advancing and retracting movements of a piston rod of the air cylinder. Since the drive source is provided on the main frame, the carrier tape can be fed at a free timing.

Japanese Patent Application laid open for public inspection under Publication No. 10(1998)-112598 discloses an EC feeder wherein a stepper motor as a sort of electric rotary motor is provided on a main frame of the feeder, as a drive source for feeding a carrier tape.

In any manner, it is preferable to start and stop the feeding of the carrier tape with the least possible vibration. For example, in the case where the carrier tape includes an accommodating tape having, at the predetermined component-carry pitch, a plurality of accommodating pockets which accommodate the plurality of ECs, respectively; and a cover tape which is attached to the accommodating tape to close the accommodating pockets, each of the ECs is moved to the EC-taking position, by the feeding of the carrier tape, after the cover tape has been peeled from the accommodating tape. If the vibration produced when the feeding of the carrier tape is started or stopped is great, each EC may jump out of the accommodating pocket, or may change its posture in the pocket. In the latter case, each EC-suction head may fail to hold the EC.

In the case where there are no limitations to the time that can be used to feed the carrier tape, the tape may be fed at low speed, acceleration, and deceleration, so that the feeding of the tape may be started and stopped with little vibration. However, in many cases, there are some limitations. For example, in the EC mounting system, disclosed in the above-indicated Japanese patent document 7-9381, in which the EC feeder is employed for supplying the ECs to the EC mounting device, the efficiency with which the ECs are mounted on a circuit substrate such as a printed-circuit board is improved by shortening the head-operation cycle time defined as the time that is needed to rotate each EC-suction head to a stop position (i.e., an operation station) after the prior EC-suction head is rotated to the stop position. Shortening the head-operation cycle time needs feeding quickly each EC to the EC-taking position.

In the EC feeder disclosed in the above document, the motion converting device which includes the cam and the cam follower transmits, to the drive member, the rotation of the servomotor as the drive device for the intermittent-rotation body. However, the shape of the cam is not determined such that the drive member drives the driven member such that the feeding of the carrier tape is started and stopped with little vibration. Consequently the carrier tape is vibrated. To solve this problem, the leading portion of the carrier tape is covered by a cover member, and the cover member is moved with the tape when the tape is fed. Thus, each EC is prevented from jumping out of the accommodating pocket. When each EC-suction head takes the EC from the pocket, the cover member is moved away from a position right above the EC, to allow the head to take the EC. However, this arrangement is not simple.

In the case where the air cylinder as the drive source is provided on the main frame of the EC feeder, a motion converting device which includes a ratchet wheel, a sprocket, and a pivotable member with a ratchet pawl converts the advancing and retracting movements of the piston rod of the air cylinder, into the feeding of the carrier tape. In this case, too, the feeding of the carrier tape is started and stopped with vibration.

Moreover, in the case where the stepper motor as the drive source is provided on the main frame of the EC feeder, the feeding of the carrier tape is started and stopped with little vibration, and the tape is fed at a high speed, since the stepper motor can be controlled with respect to its rotation speed and its stop position. However, the stepper motor itself is expensive, and it is difficult to employ a control device which controls the stepper motor with accuracy. Thus, this feeder costs high.

SUMMARY OF THE INVENTION

It is therefore an object of the present invention to provide an electric-component feeder which starts and/or stops the feeding of a carrier tape with little vibration and which costs low.

It is another object of the present invention to provide a feeder system which includes a plurality of electric-component feeders and a support table to which each of the feeders is detachably attached.

The present invention provides an electric-component feeder and a feeder system which have one or more of the technical features that are described below in respective paragraphs given parenthesized sequential numbers (1) to (14). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needed. However, the following technical features and the appropriate combinations thereof are just examples to which the present invention is by no means limited.

(1) According to a first feature of the present invention, there is provided an electric-component feeder for feeding a carrier tape carrying a plurality of electric components at a predetermined component-carry pitch, at a tape-feed pitch equal to a quotient obtained by dividing the component-carry pitch by an integral number, and thereby supplying the electric components, one by one, the feeder comprising a main frame including a tape guide which guides the carrier tape in a lengthwise direction thereof; a cam which has a cam surface and which is provided on the main frame such that the cam surface is movable relative to the main frame; a cam drive device which is supported by the main frame and which drives the cam and thereby moves the cam surface relative to the main frame; a cam follower which is supported by the main frame and which follows the cam surface while being moved by the cam surface being moved by the cam drive device; and a motion converting device which is supported by the main frame and which converts the motion of the cam follower into the feeding of the carrier tape at the tape-feed pitch along the tape guide of the main frame. The cam drive device may, or may not, include a drive source such as a servomotor, an air cylinder, or a stepper motor. In the case where the cam drive device does not include a drive source, the cam drive device may include a drive-force transmitting device which transmits the drive force of a drive source provided separately from the main frame, to the cam so as to drive the same. The carrier tape may be the above-described one that includes the accommodating tape having, at the predetermined component-carry pitch, the plurality of accommodating pockets which accommodate the plurality of electric components ("ECs"), respectively; and the cover tape which is attached to the accommodating tape to close the accommodating pockets. Otherwise, the carrier tape may be one which carries a plurality of ECs each having lead wires and which includes a pair of elongate EC-holding tapes which cooperate with each other to hold the lead wires of each EC. The EC feeder may be one which includes a carrier-tape storing device provided on the main frame, or one which includes a carrier-tape storing device provided separately from the main frame. The carrier-tape storing device is for storing the carrier tape. In the present EC feeder, the cam is driven by the cam drive device, and the motion of the cam follower following the cam surface of the cam is converted by the motion converting device into the feeding of the carrier tape. The cam and the cam follower are provided on the main frame. The motion of the cam follower can be directly transmitted to the motion converting device, and the shape of the cam surface can be so formed as to start and stop the feeding of the carrier tape with little vibration. In this case, the carrier tape is accurately moved, according to the shape of the cam surface, such that the feeding of the carrier tape is started and stopped with little vibration. Even in the case where there are some limitations to the time that can be used to feed the carrier tape, the cam surface may be so formed as to feed the carrier tape at a high speed or in a short time while reducing the vibration of the tape. In the case where the carrier tape is one which carries the ECs in the accommodating pockets, the present feeder is free from the problem that each EC jumps out of the corresponding pocket from which the cover tape has been removed, or stands up in the pocket. Thus, the present feeder does not need a cover member for covering the carrier tape. The drive source may be provided separately from the main frame of the EC feeder, or may be provided on the main frame according to the second feature (2) described below. In the former case, a servomotor as a drive source of a different device may be used as the drive source of the cam drive device, as disclosed in the above-indicated document No. 7-9381, and the rotation of the servomotor may be transmitted by the motion converting device to a drive member provided separately from the main frame, so that the drive member drives the cam drive device.

(2) According to a second feature of the present invention that includes the first feature (1), the cam drive device comprises a drive source which is provided on the main frame and which drives the cam. The drive source may be a common electric rotary motor which is not controllable with respect to its rotation angle, as explained later, may be a linear motor, or may be a fluid-pressure-operated cylinder device, such as an air cylinder or an oil cylinder, as a sort of fluid-pressure-operated actuator. Irrespective of which sort of drive source may be used, the cam surface can be so formed as to start and stop the feeding of the carrier tape with little vibration.

(3) According to a third feature of the present invention that includes the second feature (2), the cam surface comprises a predetermined-position keeping portion which does not move, while the cam is driven by the cam drive device, the cam follower and thereby keeps the cam follower at a predetermined position, and the cam drive device comprises a drive-source control device which stops the drive source from driving the cam, in a state in which the cam follower is engaged with the predetermined-position keeping portion of the cam surface. In the state in which the cam follower is engaged with the predetermined-position keeping portion of the cam surface, the carrier tape is not fed. Thus, at any timing within a time period in which the cam follower is engaged with the keeping portion, the drive source may be stopped without influencing the cam follower or the carrier tape. Therefore, the cam follower can be accurately stopped at a desired position, even in the case where the drive source is one which cannot be accurately stopped. Accordingly, the EC feeder can be produced at low cost.

(4) According to a fourth feature of the present invention that includes the second or third feature (2) or (3), the cam surface comprises an accelerating portion, and a decelerating portion, which move the cam follower so as to accelerate, and decelerate, the carrier tape smoothly from, and to, zero, respectively, while the cam is driven by the cam drive device at a predetermined speed. It is preferred that the accelerating and decelerating portions be formed such that the carrier tape is fed at the lowest possible acceleration and deceleration, and such that the carrier tape is fed at the lowest possible derivatives of the acceleration and the deceleration.

(5) According to a fifth feature of the present invention that includes any one of the first to fourth features (1) to (4), the cam comprises a rotary cam which is rotatable about an axis line. The cam is not limited to the rotary cam, but may be one which is reciprocatively moved along a straight line by a linear motor as the drive source and which has the cam surface formed along the straight line. However, the rotary cam occupies a small space only, which contributes to producing a compact EC feeder.

(6) According to a sixth feature of the present invention that includes the fifth feature (5), the cam drive device comprises a drive source which is provided on the main frame and which drives the cam, and the drive source comprises an electric rotary motor which is not controllable with respect to a rotation angle thereof. This electric rotary motor is a commonly used motor, and is not a servomotor or a stepper motor that is accurately controllable with respect to its rotation angle, rotation speed, and/or stop position. For example, this rotary motor may be a direct-current (DC) motor or an alternating-current (AC) motor. In the case where the EC feeder employs the rotary motor as the drive source, the rotary motor can more quickly respond than an air cylinder, and can rotate the cam at a higher speed, so that the carrier tape can be fed at a higher speed. In addition, the present EC feeder costs lower than an EC feeder which employs a servomotor or a stepper motor as the drive source.

(7) According to a seventh feature of the present invention that includes the sixth feature (6), the electric rotary motor comprises a direct-current motor. The direct-current (DC) motor enjoys the advantages of a high energy efficiency, a low price, and a compact construction.

(8) According to an eighth feature of the present invention that includes the sixth or seventh feature (6) or (7), the cam drive device further comprises a speed reducing device which transmits a rotation of the electric rotary motor to the cam while reducing a speed of the rotation. In this case, it is possible to employ, as the electric rotary motor, a widely used motor which has a considerably high rated speed. This contributes to reducing the cost of the EC feeder.

(9) According to a ninth feature of the present invention that includes the eighth feature (8), the speed reducing device comprises a worm and a worm wheel. Respective lead angles of the worm and the worm wheel may be so determined that the worm can rotate the worm wheel but the worm wheel cannot rotate the worm. In this case, the electric rotary motor being stopped cannot be rotated by a force exerted thereto from the side of the carrier tape, even without employing an exclusive device for keeping the rotary motor stopped or supplying an electric current to the motor so as to produce a torque to keep the motor stopped. Thus, the production cost of the EC feeder can be decreased, and the electric power used to operate the feeder can be reduced.

(10) According to a tenth feature of the present invention that includes any one of the first to ninth features (1) to (9), the carrier tape has a plurality of tape-feed holes at a predetermined feed-hole pitch in the lengthwise direction thereof, and the motion converting device comprises a sprocket which is rotatable about an axis line and which has a plurality of engaging projections at least one of which engages at least one of the tape-feed holes of the carrier tape; a ratchet wheel which has a plurality of teeth and which is rotatable about the axis line together with the sprocket; a ratchet pawl which is engageable with at least one of the teeth of the ratchet wheel; and a pivotable member which supports the ratchet pawl and which is pivotable about the axis line.

(11) According to an eleventh feature of the present invention that includes any one of the first to tenth features (1) to (10), the carrier tape comprises an accommodating tape having, at the predetermined component-carry pitch, a plurality of accommodating pockets which accommodate the plurality of electric components, respectively; and a cover tape which is attached to the accommodating tape to close the accommodating pockets, and the feeder further comprises a cover-tape feeding device which feeds a portion of the cover tape that is peeled from the accommodating tape. The cover-tape feeding device may be one which performs both peeling of the cover tape from the accommodating tape and the feeding of the peeled portion of the cover tape, or one which performs only the feeding of the peeled cover tape. In the second case, the EC feeder further comprises a cover-tape peeling device.

(12) According to a twelfth feature of the present invention that includes the eleventh feature (11), the cam drive device comprises a drive source which is provided on the main frame and which drives the cam, and the cover-tape feeding device comprises a drive source which is provided by the drive source of the cam drive device.

(13) According to a thirteenth feature of the present invention, there is provided a feeder system comprising a plurality of feeders each according to any one of the first to twelfth features (1) to (12), and a support table to which each of the feeders is detachably attached.

(14) According to a fourteenth feature of the present invention, there is provided an electric-component feeder for feeding a carrier tape carrying a plurality of electric components at a predetermined component-carry pitch, at a tape-feed pitch equal to a quotient obtained by dividing the component-carry pitch by an integral number, and thereby supplying the electric components, one by one, the feeder comprising a main frame including a tape guide which guides the carrier tape in a lengthwise direction thereof; a Geneva mechanism which is supported by the main frame and which includes a drive wheel having at least one pin and a locking disc, and a driven wheel having a plurality of grooves and a plurality of arcuate surfaces, the driven wheel being rotated by a rotation of the drive wheel because of engagement of the pin with each of the radial grooves, and being not rotated during the rotation of the drive wheel because of engagement of the locking disc with each of the arcuate surfaces; a drive device which is supported by the main frame and which rotates the drive wheel of the Geneva mechanism; and a motion converting device which is supported by the main frame and which converts the rotation of the driven wheel into the feeding of the carrier tape at the tape-feed pitch along the tape guide of the main frame. A Geneva mechanism cannot enjoy so high a degree of freedom regarding its operation characteristics (e.g., speed, acceleration, derivative of acceleration) like a cam mechanism which can do so owing to alteration of the shape of a cam. However, the driven wheel can be accurately stopped at a desired position by just stopping the drive wheel in a state in which the locking disc is engaged with each of the arcuate surfaces. Thus, the drive device can smoothly accelerate and decelerate the driven wheel of the Geneva mechanism, even if the drive device may not be one which is so accurately controllable. Thus, the Geneva mechanism and the drive device function like the cam, the cam drive device, and the cam follower. The fourteenth feature (14) may be combined with each of the second, third, and sixth to thirteenth features (2), (3), and (6) to (13), subject to the condition that the cam is replaced with the drive wheel.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which:

FIG. 17A is a view showing one step of a cover-tape feeding operation of the cover-tape feeding device of FIG. 4;

FIG. 17B is a view showing another step of the cover-tape feeding operation;

FIG. 19A is a view showing one step of a cover-tape feeding operation of a cover-tape feeding device of another EC feeder as a second embodiment of the present invention;

FIG. 19B is a view showing another step of the cover-tape feeding operation of the cover-tape feeding device of FIG. 19A;

FIG. 20A is a view showing one step of a cover-tape feeding operation of a cover-tape feeding device of yet another EC feeder as a third embodiment of the present invention;

FIG. 20B is a view showing another step of the cover-tape feeding operation of the cover-tape feeding device of FIG. 20A;

DETAILED DESCRIPTION OF THE PREFERRED EMBODIMENTS

Figure 1:
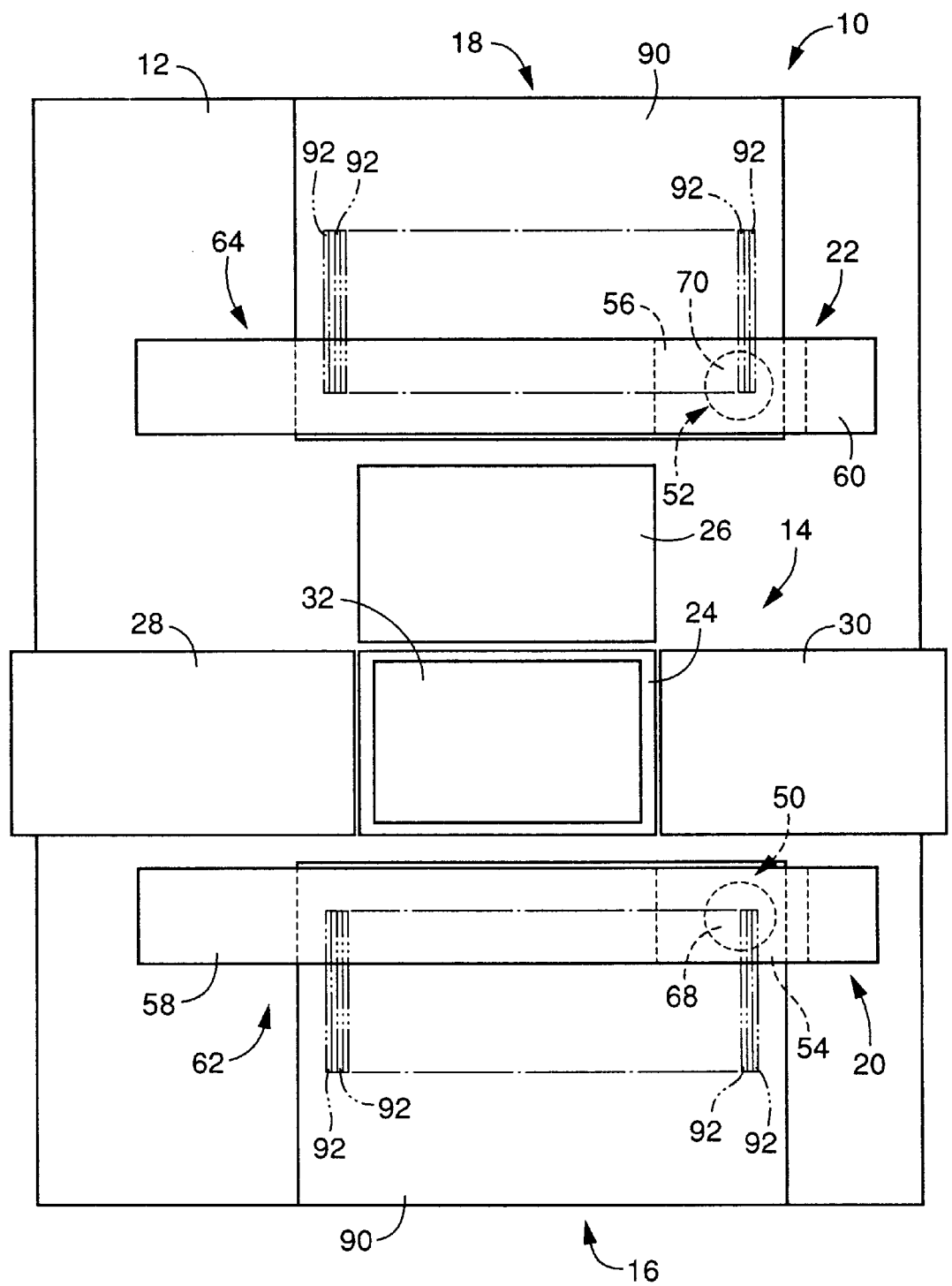
FIG. 1 is a schematic plan view of an electric-component ("EC") mounting system including an EC supplying apparatus including a plurality of pairs of EC feeders each of which embodies the present invention.

Referring to the drawings, there will be described an electric-component ("EC") mounting system 10 which mounts ECs on a circuit substrate as an example of an object. The EC mounting system 10 includes two EC supplying apparatuses 16, 18 each of which includes a plurality of pairs of EC feeders 92 each of which embodies the EC feeder of the present invention.

The present EC mounting system 10 cooperates with a screen printing system and a solder reflowing system to provide an electric-circuit assembly line. The screen printing system is provided on an upstream side of the EC mounting system 10 in a direction in which a printed circuit board ("PCB") 32 as the circuit substrate on which ECs are to be mounted is conveyed. The screen printing system prints a solder paste on the PCB 32. The EC mounting system mounts ECs on the solder paste printed on the PCB 32. The solder reflowing system is provided on a downstream side of the EC mounting system 10 in the same direction. The solder reflowing system reflows or melts the solder paste to connect electrically the ECs to the PCB 32.

As shown in FIG. 1, the EC mounting system 10 includes a base table 12 on which a PCB conveyor 14, the two EC supplying apparatuses 16, 18, and two EC transferring and mounting apparatuses 20, 22 are provided. The PCB conveyor 14 and the EC transferring and mounting apparatuses 20, 22 have the same constructions as those described in U.S. Pat. No. 6,073,342 assigned to the Assignee of the present application, and accordingly will be described briefly below.

The PCB conveyor 14 includes two main conveyors 24, 26, a single carry-in conveyor 28, and a single carry-out conveyor 30. Each of the two main conveyors 24, 26 includes a PCB positioning and supporting device (not shown) which positions and supports a PCB 32. The two main conveyors 24, 26 are arranged in a direction which is, in a horizontal plane, perpendicular to the direction of conveying of the PCB 32 (hereinafter, referred to as the "PCB-convey direction"), i.e., the left to right direction in FIG. 1. In the present embodiment, the PCB-convey direction may be referred to as the X-axis direction, and the direction in which the two main conveyors 24, 26 are arranged may be referred to as the Y-axis direction. The carry-in conveyor 28 is provided on an upstream side of the main conveyors 24, 26 in the PCB-convey direction, and can be shifted by a carry-in-conveyor shifting device (not shown) to a first shift position where the carry-in conveyor 28 is aligned with the first main conveyor 24, and to a second shift position where the carry-in conveyor 28 is aligned with the second main conveyor 26. The carry-in conveyor 28 receives, from the screen printing system, the PCB 32 on which the solder paste has just been screen-printed, and conveys the PCB 32 to the first or second main conveyor 24, 26.

The carry-out conveyor 30 is provided on a downstream side of the main conveyors 24, 26 in the PCB-convey direction, and can be shifted by a carry-out-conveyor shifting device (not shown) to a first shift position where the carry-out conveyor 30 is aligned with the first main conveyor 24, and to a second shift position where the carry-out conveyor 30 is aligned with the second main conveyor 26. The carry-out conveyor 30 receives, from the first or second main conveyor 24, 26, the PCB 32 on which the ECs have been mounted, and conveys the PCB 32 to the solder reflowing system.

The two EC transferring and mounting apparatuses 20, 22 include respective EC mounting heads 50, 52, and respective X-Y robots 62, 64. The two X-Y robots 62, 64 include respective X-axis slides 54, 56, and respective Y-axis slides 58, 60, and move the respective EC mounting heads 50, 52 to respective desired positions in a horizontal plane. The two Y-axis slides 58, 60 are provided on the base table 12 such that each slide 58, 60 is movable in the Y-axis direction, and the two X-axis slides 54, 56 are provided on the two Y-axis slides 58, 60, respectively, such that each X-slide 54, 56 is movable in the X-axis direction. The two EC mounting heads 50, 52 include respective intermittent-rotation bodies 68, 70 which are attached to the respective X-axis slides 54, 56 such that each body 68, 70 is intermittently rotatable at a predetermined angular pitch about a vertical axis line. Each body 68 can be rotated by any desired angle in either desired direction by a corresponding rotating or driving device (not shown) which includes, as its drive source, a servomotor as an example of an electric motor which can be controlled with accuracy with respect to its rotation amount or angle. The servomotor may be replaced by a stepper motor.

Figure 3:
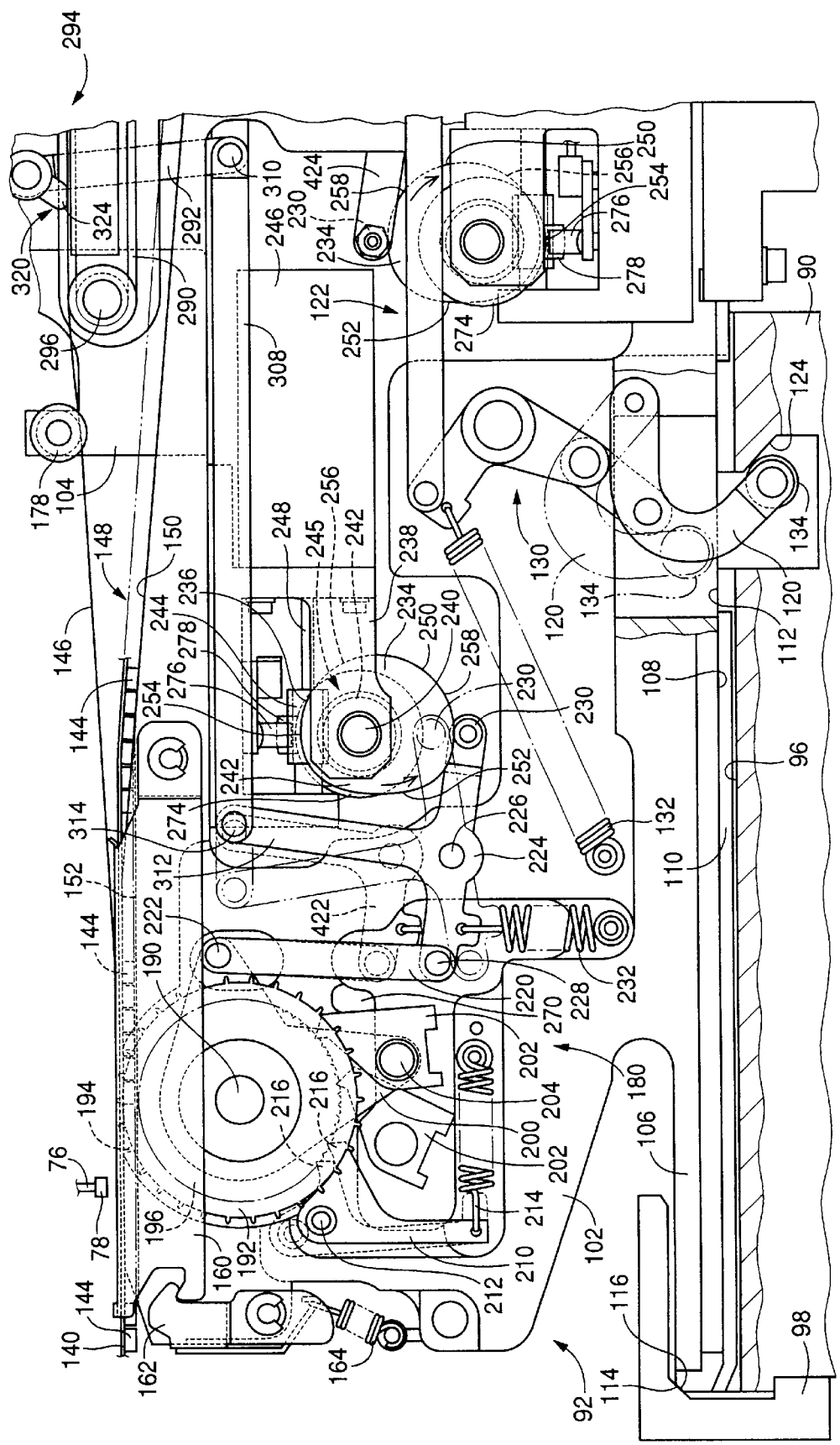
FIG. 3 is a partly cross-sectioned, front elevation view of a carrier-tape feeding device of the EC feeder of FIG. 1.

Each intermittent-rotation body 68, 70 has sixteen EC suckers 76 (only one 76 is shown in FIG. 3) as a plurality of EC holders. The EC suckers 76 are provided on each body 68, 70 such that the EC suckers 76 are arranged on a circle whose center rides on the axis line of rotation of each body 68, 70 and such that the suckers 76 are equiangularly spaced from each other about the same axis line. Each EC sucker 76 is supported by each body 68, 70 such that the sucker 76 is movable in a direction parallel to the above-indicated axis line and is rotatable about an axis line of the sucker 76 itself. When each body 68, 70 is intermittently rotated, the sixteen EC suckers 76 on the body 68, 70 are revolved around the axis line of the body 68, 70, so that the EC suckers 76 are sequentially moved to an EC-suck-and-mount position where each EC sucker 76 sucks and mounts an EC 78.

Figure 5:
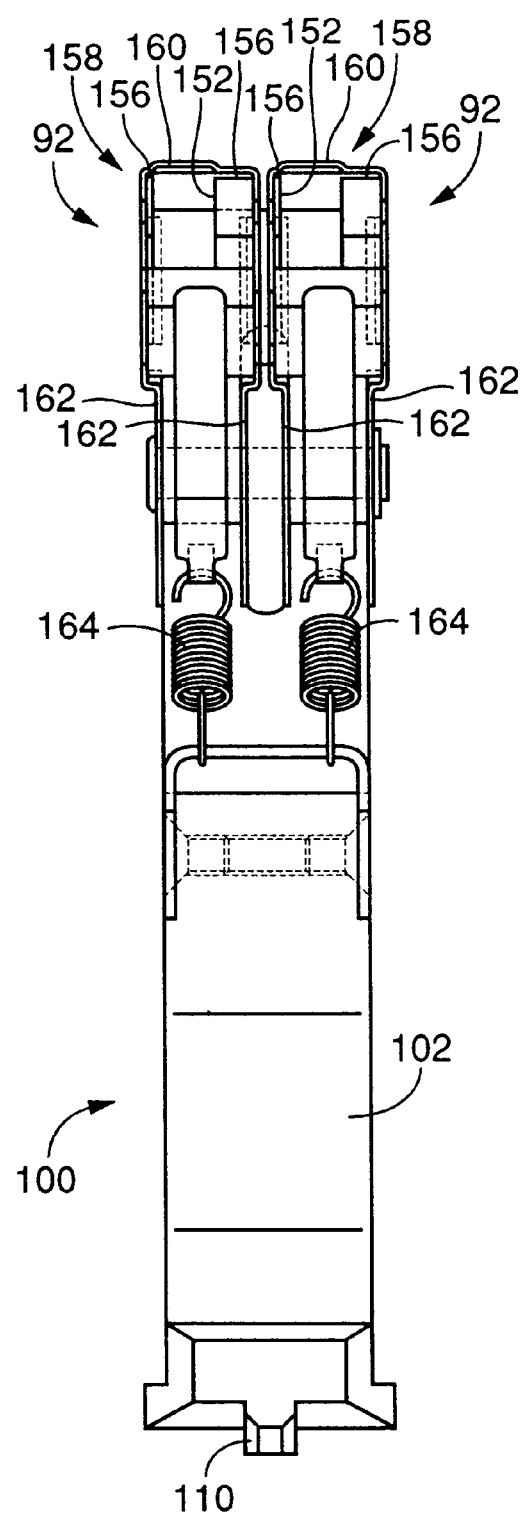
FIG. 5 is a left-hand elevation view of the pair of EC feeders of FIG. 2.

Each of the two EC supplying apparatuses 16, 18 includes a feeder support table 90, and a plurality of pairs of EC feeders 92 which are detachably attached to the feeder support table 90 such that respective EC-supply portions of the EC feeders 92 are arranged along a straight line parallel to the X-axis direction. The feeder support table 90 has a plurality of positioning grooves 96 (FIG. 3) formed at a predetermined pitch, i.e., a predetermined interval of distance in the X-axis direction. Each positioning groove 96 can position a pair of EC feeders 92 in a direction of width thereof parallel to the X-axis direction. In addition, the feeder support table 90 has a positioning member 98 fixed thereto. The positioning member 98 can position each pair of EC feeders 92 in a direction of length thereof parallel to the Y-axis direction. As shown in FIG. 5, each pair of EC feeders 92 share an integral common portion 100 which can be positioned by one of the positioning grooves 96.

The common portion 100 of each pair of EC feeders 92 is provided by a plurality of members, for the purpose of easier production thereof. As shown in FIG. 3, the common portion 100 includes a generally elongate plate-like support member 102, and a thin plate-like bracket 104 fixed to the support member 102. The support member 102 includes a fitting projection 106 which projects frontward from a front and lower end portion thereof. The fitting projection 106 has a positioning rib 110 which projects downward from a bottom surface 108 of the projection 106 such that the rib 110 extends parallel to the lengthwise direction of the EC feeders 92. The support member 102 is positioned in its widthwise direction by one positioning groove 96, with the positioning rib 110 being fitted in the groove 96. In addition, the bottom surface 108 of the support member 102 is supported on a support surface 112 defined by an upper surface of the feeder support table 90. Moreover, an inclined surface 114 formed at the front end of the fitting projection 106 is engaged with an inclined surface 116 formed on the positioning member 98, so that the pair of EC feeders 92 are positioned in their lengthwise direction.

Figure 2:
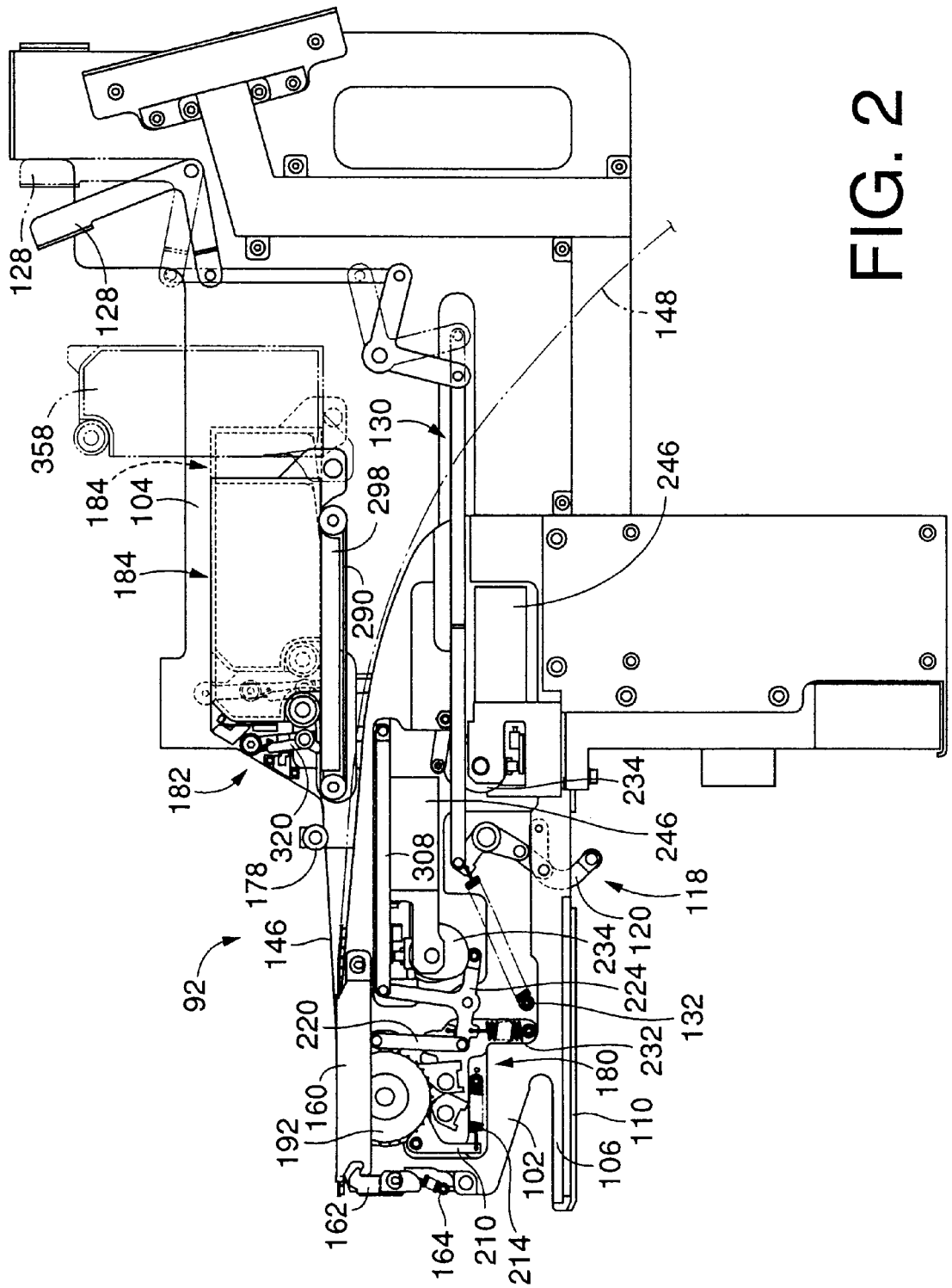
FIG. 2 is a front elevation view of one pair of EC feeders of FIG. 1.

The support member 102 is provided with a fixing device 118 (FIG. 2) which fixes the pair of EC feeders 92 to the feeder support table 90. The fixing device 118 includes an engaging lever 120, and an engaging-lever actuating device 122. When the engaging lever 120 is engaged with a fixing-force generating surface 124 formed on the feeder support table 90, the common portion 100 is fixed to the support table 90 and accordingly the pair of EC feeders 92 are fixed to the table 90. The fixing-force generating surface 124 is an inclined surface whose distance from the support surface 112 increases in a rearward direction. The fixing device 118 is described in detail in U.S. Pat. No. 5,930,140 assigned to the Assignee of the present application, and accordingly will be described briefly below.

The engaging-lever actuating device 122 includes an operating lever 128 (FIG. 2) which is attached to the bracket 104 such that the operating lever 128 is pivotable about a horizontal axis line; an operating-force transmitting device 130 which includes links and levers and transmits, to the engaging lever 120, the operating force applied by an operator to the operating lever 128; and a tension coil spring 132 as an example of a biasing device. When the engaging lever 120 is pivoted by the biasing force of the coil spring 132 and accordingly an engaging roller 134 rotatably attached to the lever 120 is pressed against the fixing-force generating surface 124, the inclined surface 114 is pressed against the inclined surface 116 by the reaction force, e.g., fixing force generated by the surface 124. Because of the effect of the inclination of the surfaces 114, 116, a front end portion of the common portion 100 is pressed against the support surface 112 of the feeder support table 90. In addition, because of the effect of the inclination of the surface 124, a rear end portion of the common portion 100 is pressed against the support surface 112. The pair of EC feeders 92 can be detached from the support table 90 in such a way that the operator operates the operating lever 128 to retract the engaging lever 120 into the support member 102, as indicated in two-dot chain lines in FIG. 2, and thereby disengages the engaging roller 134 from the surface 124.

Figure 7:
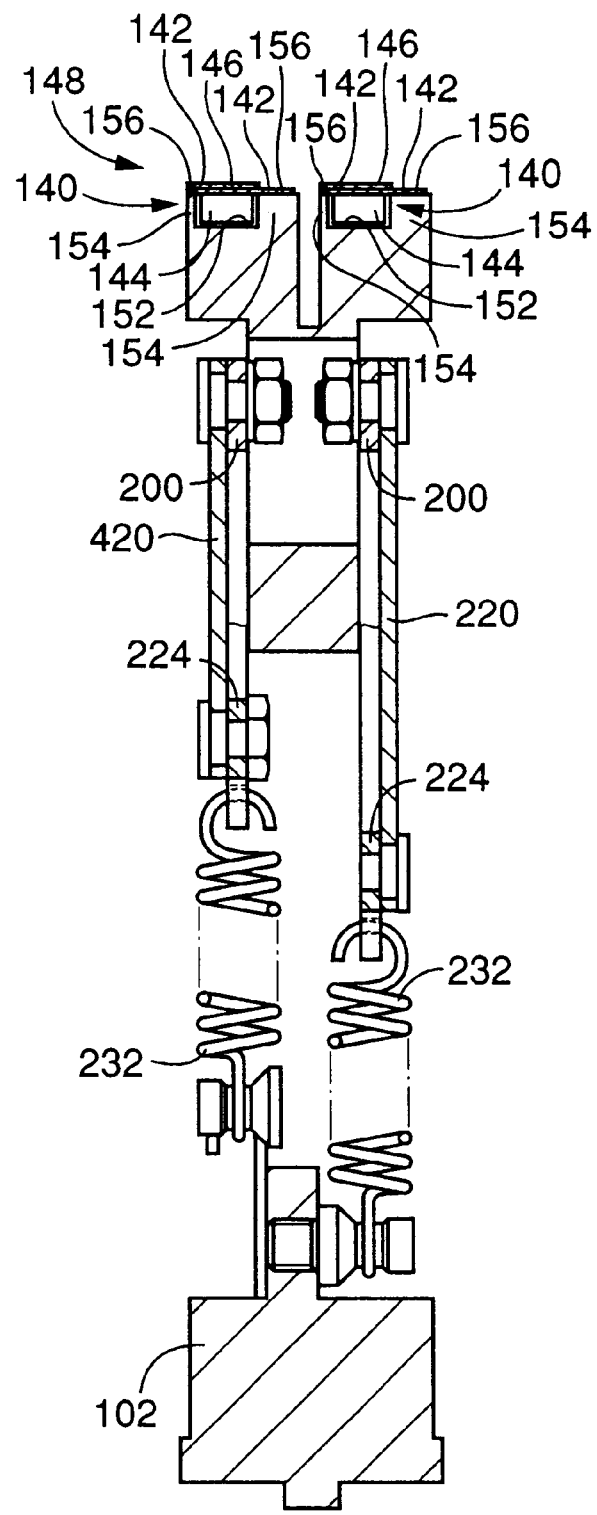
FIG. 7 is a cross-sectioned, elevation view of the pair of EC feeders of FIG. 2 taken along a line passing through a position where the pivotable plate is connected to a link.

Each of the pair of EC feeders 92 feeds an EC carrier tape 148 which carries a plurality of ECs 78. The carrier tape 148 includes an EC accommodating tape 140 and a cover tape 146. As shown in FIG. 7, the accommodating tape 140 includes a pair of side portions 142 which extend parallel to each other in the lengthwise direction of the tape 140; and a number of EC accommodating portions 144 which project downward from, and between, the two side portions 142, at a predetermined interval of distance in the lengthwise direction. Each EC accommodating portion 144 defines an EC accommodating pocket which opens upward and which accommodates an EC 78. The respective openings of the EC accommodating pockets are closed by the cover tape 146 adhered to the EC accommodating tape 140. One of the two side portions 142 has a number of tape-feed holes which are formed through the thickness thereof, at a predetermined regular interval in the lengthwise direction.

The EC carrier tape 148 is wound around a tape reel (not shown), and the tape reel is rotatably held by a reel holder (not shown) which is provided in the rear portion of the support member 102. A length of the carrier tape 148 drawn from the tape reel is introduced to the front portion of the support member 102, via a guide surface 150 defined by an upper surface of the support member 102. As shown in FIGS. 3 and 7, the support member 102 has, in the front portion thereof, two grooves 152 which extend parallel to each other in the lengthwise direction of the common portion 100. Each of the grooves 152 is defined by two side walls 154 whose upper surfaces provide respective support surfaces 156. Thus, around the EC-supply portion of each EC feeder 92, the two side portions 142 of the EC accommodating tape 140 are supported on the corresponding support surfaces 156, and the EC accommodating portions 144 are fitted in the groove 152. Each groove 152 has a width which can receive a plurality of sorts of EC accommodating portions 144 having different widths.

Figure 6:
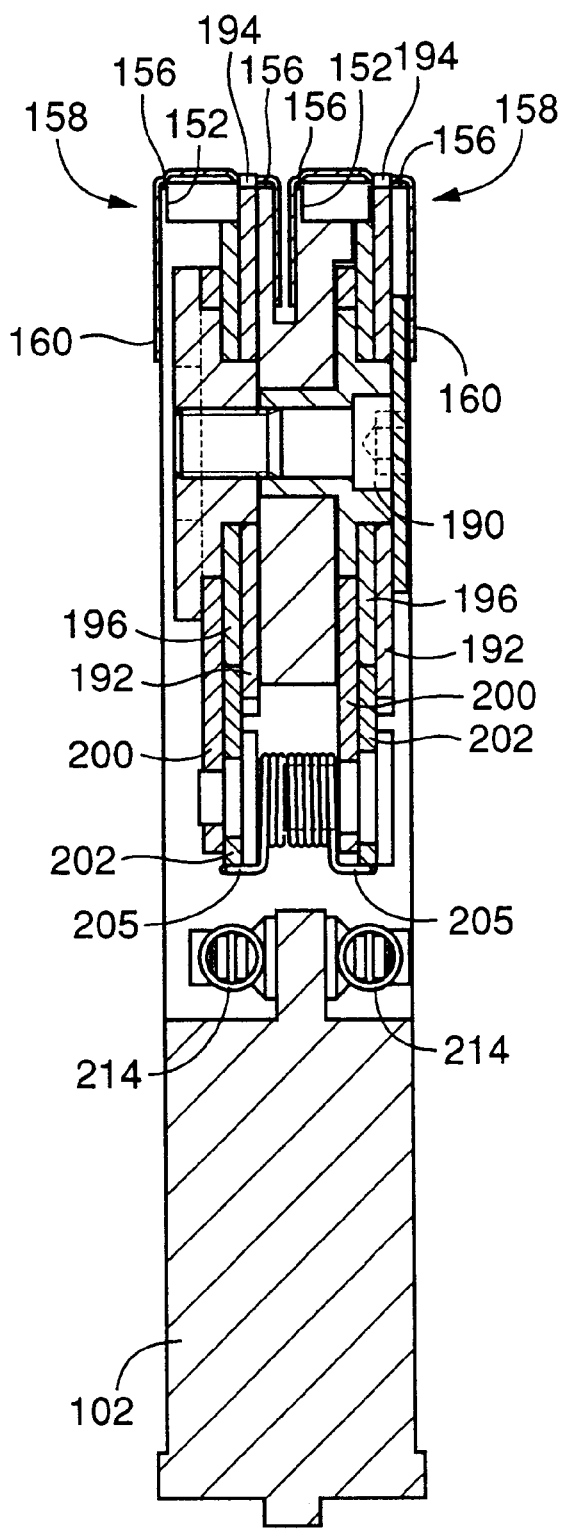
FIG. 6 is an elevation view of the pair of EC feeders of FIG. 2 taken along a line passing through a position where a pivotable plate is pivotally connected.

A cover member 160 covers a front portion of the EC carrier tape 148, to prevent the tape 148 from moving up from the support member 102. The cover member 160 has a generally inverted-U-shaped cross section, as shown in FIG. 6. Each of the pair of EC feeders 92 has one cover member 160. As shown in FIG. 3, each cover member 160 is attached, at one of lengthwise opposite end portions thereof, to the support member 102 such that the cover member 160 is pivotable about a horizontal axis line. A pair of engaging members 162 which are pivotally attached to the support member 102, are engageable with the other lengthwise end portion of each cover member 160. The engaging members 162 are biased by a tension coil spring 164 as an elastic member as an example of a biasing device, so that the top wall of the cover member 160 is biased toward the support member 102. Thus, the EC carrier tape 148 is effectively prevented from moving up. The pair of side walls of the cover member 160 engage the respective outer side edges of the two side portions 142 of the carrier tape 148. Thus, the carrier tape 148 is guided by the cover member 160 while being positioned with respect to its widthwise direction. The pair of support surfaces 156 and the cover member 160 cooperate with each other to provide a EC-tape guiding device 158 which guides the EC carrier tape 148 in its lengthwise direction.

Each of the pair of EC feeders 92 includes a carrier-tape feeding device 180 which feeds the EC carrier tape 148; a cover-tape feeding device 182 which feeds the cover tape 146 peeled from the EC accommodating tape 140; and a cover-tape collecting box 184 which collects the peeled cover tape 146. Since the above elements 180, 182, 184 of one of the two EC feeders 92 have substantially the same constructions as those of the other feeder 92, the elements 180, 182, 184 of one feeder 92 will be mainly described below, and those 180, 182, 184 of the other feeder 92 will be described as needed.

As shown in FIG. 3, the carrier-tape feeding device 180 includes a sprocket 192 which is supported on an axis member 190 fixed to the support member 102, such that the sprocket 192 is rotatable about a horizontal axis line perpendicular to a direction in which the EC carrier tape 14B is fed (hereinafter, referred to as the "carrier-tape-feed direction"). The carrier-tape-feed direction is parallel to the lengthwise direction of the EC feeder 92. The sprocket 192 has a number of engaging projections 194 some of which are engaged with the tape-feed holes of the EC accommodating tape 140. A ratchet wheel 196 whose diameter is smaller than that of the sprocket 192 is associated with the sprocket 192 such that the wheel 196 is concentric with the sprocket 192 and is not rotatable relative to the sprocket 192.

The axis member 190 additionally supports a pivotable plate 200 such that the plate 200 is pivotable. A ratchet pawl 202 is attached to the pivotable plate 200 via a pin 204 such that the ratchet pawl 202 is pivotable about the pin 204. A tension coil spring 205 (FIG. 6) which is provided, as an elastic member as an example of a biasing device, between the pawl 202 and the pin 204, biases the pawl 202 in a direction in which the pawl 202 engages one of teeth of the wheel 196. When the plate 200 is pivoted in a forward direction (i.e., counterclockwise in FIG. 3), the pawl 202 remains engaged with one tooth of the wheel 196; and on the other hand, when the plate 200 is pivoted in a backward direction (i.e., clockwise in FIG. 3), the pawl 202 moves over a predetermined number of the teeth of the wheel 196.

A stopper lever 210 is pivotally attached to the common portion 100 via an eccentric pin 212. Owing to a tension coil spring 214 as an elastic member as an example of a biasing force, an engaging portion 216 of the stopper lever 210 is biased in a direction in which the engaging portion 216 engages the teeth of the wheel 196. The stopper lever 210 permits the wheel 196 to be rotated counterclockwise in FIG. 3, but does not permit the wheel 196 to be rotated clockwise in FIG. 3.

The eccentric pin 212 includes a first portion which is rotatably supported by the support member 102; and a second portion which supports the stopper lever 210 such that the lever 210 is pivotable and which is eccentric with the first portion. The eccentric pin 212 is designed such that a tangent of a circular arc described by the center of the second portion thereof about that of the first portion thereof can be parallel to a tangent of the circumference (i.e., the teeth) of the ratchet wheel 196 with which the engaging portion 216 of the stopper lever 212 is engaged. The eccentric pin 212 is fixed by a fixing device (not shown) to the stopper lever 210. When the fixing device is released and the eccentric pin 212 is rotated relative to the stopper lever 210, the position of the engaging portion 216 in the circumferential direction of the ratchet wheel 196 is changed. Thus, the position where the wheel 196 is positioned by the stopper lever 210 is adjusted, and accordingly the wheel 196 can be accurately positioned at a desired angular phase. This leads to accurately keeping the leading EC 78 positioned at an EC-pick-up position.

When the pivotable plate 200 is pivoted in the forward direction, the ratchet pawl 202 is moved while being engaged with one tooth of the ratchet wheel 196. Thus, the wheel 196 is rotated in the forward direction, the sprocket 192 is rotated, and the EC carrier tape 148 is fed by one pitch. However, when the pivotable plate 200 is pivoted in the backward direction, the ratchet pawl 202 is moved over some teeth of the ratchet wheel 196. Thus, the pawl 202 prepares for the next feeding of the tape 148. The wheel 196 is not rotated, and the tape 148 is not fed.

One end portion of a link 220 is pivotably connected to the pivotable plate 200 via a pin 222. A lever 224 is pivotally attached to the support member 102 via an axis member 226, and the other end portion of the link 220 is pivotally connected to one end portion of the lever 224. A roller 230 as a cam follower is rotatably attached to the other end portion of the lever 224, and a tension coil spring 232 which is provided as a biasing device between the lever 224 and the support member 102, biases the roller 230 in a direction in which the roller 230 engages a cam surface 236 of a plate cam 234 as an example of a rotatable cam.

Figure 8:
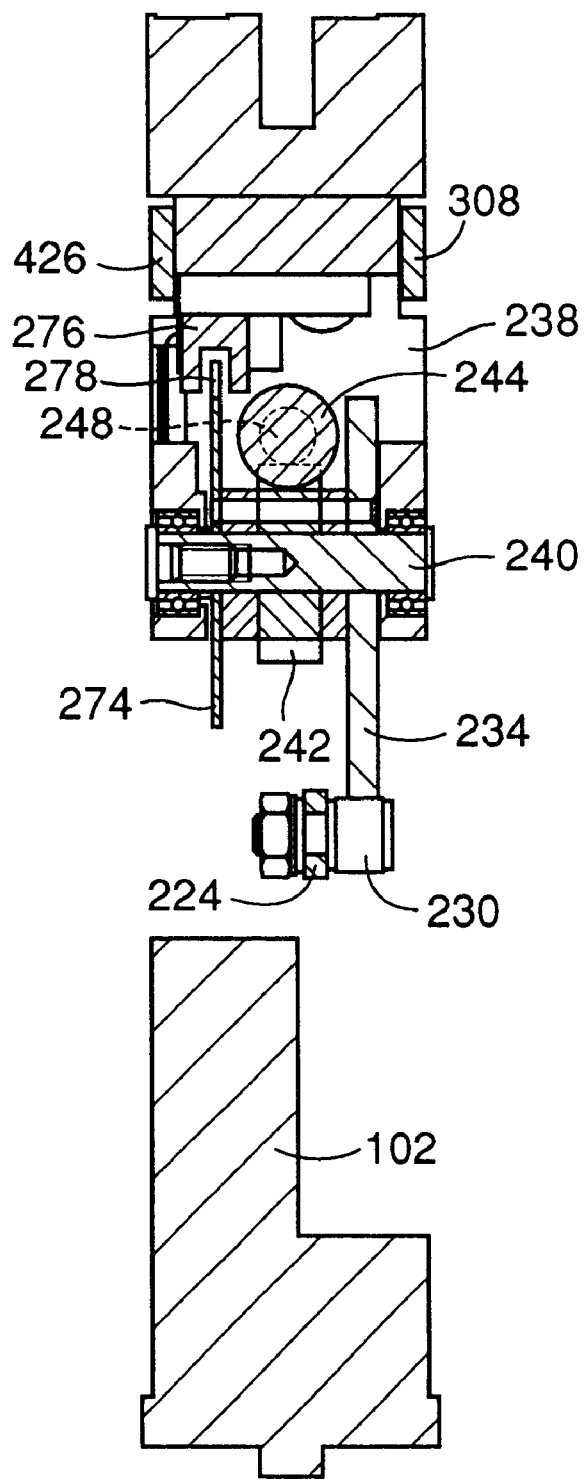
FIG. 8 is an elevation view of the pair of EC feeders of FIG. 2 taken along a line passing through a position where a plate cam is provided.

As shown in FIGS. 3 and 8, a bracket 238 is fixed to the support member 102, and cooperates with the support member 102 and the bracket 104 to provide the common portion 100. The plate cam 234 is fixed to an axis member 240 which is rotatably supported at opposite end portions thereof by the bracket 238. A worm wheel 242 which is also fixed to the axis member 240 is meshed with a worm 244 and cooperates with the worm 244 to provide a worm gear 245. A direct-current (DC) motor 246 as an electric rotary motor as an example of a drive source is fixed to the bracket 238 such that the motor 246 extends parallel to the carrier-tape-feed direction. An output shaft 248 of the motor 246 is rotatably supported by the bracket 238, and the worm 244 is fixed to the shaft 248. The DC motor 246 may be a low-price motor which can be rotated in opposite directions, i.e, forward and backward directions and can be started and stopped according to ON and OFF signals supplied thereto.

When the worm 244 is rotated by the DC motor 246, the worm wheel 242 is rotated and the plate cam 234 is rotated, so that the lever 224 is pivoted and the pivotable plate 200 is pivoted. The plate cam 234 is rotated in a direction indicated at arrow in FIG. 3. The cam surface 236 includes a carrier-tape-feed surface 250, a feed-prepare surface 252, and a position-keep surface 254. When the cam 234 is rotated with the roller 230 engaging the carrier-tape-feed surface 250, the distance between the center of the cam 234 and the roller 230 is increased. Thus, the roller 230 is moved to cause the pivotable plate 200 to be pivoted in the forward direction and thereby feed the EC carrier tape 148. When the cam 234 is rotated with the roller 230 engaging the feed-prepare surface 252, the distance between the center of the cam 234 and the roller 230 is decreased. Thus, the roller 230 is moved to cause the pivotable plate 200 to be pivoted in the backward direction and thereby prepare for the next carrier-tape-feed action. The position-keep surface 254 has a constant distance from the center of the cam 234, and does not cause the roller 230 to be moved relative thereto or does not cause the pivotable plate 200 to be pivoted. The position-keep surface 254 is provided on a downstream side of, and adjacent to, the carrier-tape-feed surface 250 in the direction of rotation of the cam 234. The carrier-tape-feed surface 250 includes an accelerating surface 256 and a decelerating surface 258 which apply, to the roller 230, respective motions which accelerate and decelerate the EC carrier tape 148. The accelerating surface 256 is so formed that the rate of change of acceleration is minimum, i.e., that the tape 148 is smoothly accelerated from the speed of zero. Similarly, the decelerating surface 258 is so formed that the rate of change of deceleration is minimum, i.e., that the tape 148 is smoothly decelerated to the speed of zero. Thus, the tape 148 can be started and stopped with the least possible vibration. The plate cam 234 has a small position-keep surface which is between the carrier-tape-feed surface 250 and the feed-prepare surface 252 and which is opposite to the position-keep portion 254. The small position-keep surface is formed for the purpose of easier production of the cam 234.

A stopper 270 projects from the support member 102. The stopper 270 engages the ratchet pawl 202 and thereby stops the pivotable plate 200, when the plate 200 is additionally pivoted in the forward direction due to, e.g., inertia after the plate 200 has been pivoted in the same direction by the engaging of the roller 230 with the carrier-tape-feed surface 250. Thus, the leading EC 78 is kept positioned at the EC-pick-up position. The above additional movement of the plate 200 is allowed by the dimensional tolerances of the roller 230, the cam surface 236, and other elements.

Moreover, as shown in FIGS. 3 and 8, a rotatable plate 274 as a member to be detected is fixed to the axis member 240 and accordingly is rotated with the plate cam 234. An origin-position sensor 276 is provided on the bracket 238. The origin-position sensor 276 is a transmission-type photoelectric sensor which includes a light emitter and a light detector. The rotatable plate 274 includes a central portion whose diameter cannot pass through the space between the light emitter and detector of the sensor 276; and a detectable portion 278 which projects radially outward from the central portion and can pass through the space between the light emitter and detector. When the detectable portion 278 is located between the space between the light emitter and detector, the light emitted from the light emitter cannot be detected by the light detector. Thus, the origin position of the plate cam 234 can be detected. The origin position of the cam 234 is the position where the pivotable plate 200 has just been rotated in the backward direction for preparing the next feeding of the tape 148 and where the roller 230 is engaged with the position-keep surface 254. FIG. 3 shows the state in which one carrier-tape feeding action has finished and preparation of the next feeding action is about to start.

The cover member 160 has an opening (not shown) at a position corresponding to the EC-supply portion around the EC pick-up position. Thus, the EC sucker 76 is allowed to pick up the leading EC 78. In addition, the cover member 160 has an elongate hole (not shown) at a position corresponding to the tape-feed holes of the EC accommodating tape 140. Thus, the cover member 160 is prevented from interfering with the engaging projections 194 of the sprocket 192. The cover tape 146 peeled or removed from the accommodating tape 140 is drawn through the above-described opening of the cover member 160, then is engaged with a guide pulley 178, and finally is fed by the cover-tape feeding device 182 to the cover-tape collecting box 184. The guide pulley 178 which has a pair of flanges is rotatably attached to the bracket 104. The cover tape 146 is fitted in the space between the pair of flanges of the guide pulley 178, so that the tape 146 is inhibited from being moved in its widthwise direction.

Figure 9:
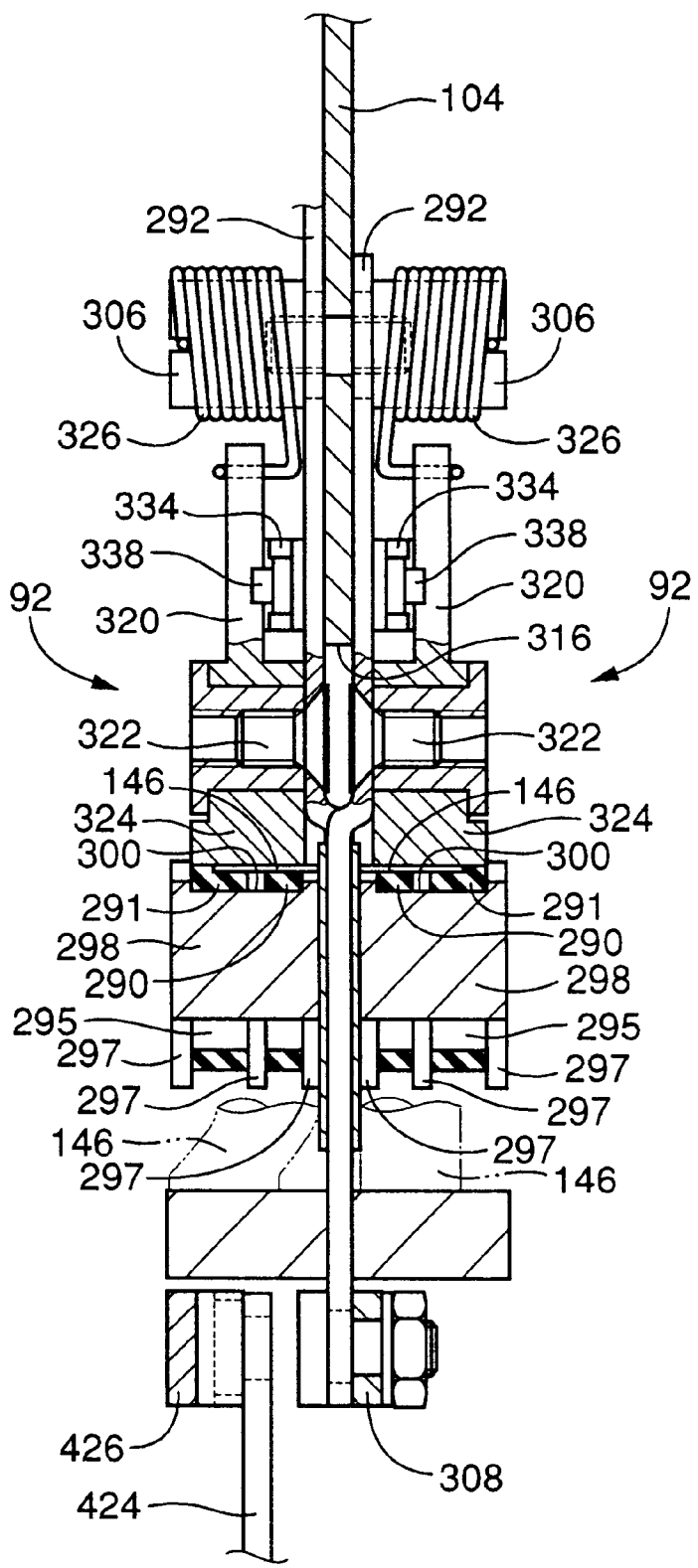
FIG. 9 is an elevation view of the pair of EC feeders of FIG. 2 taken along a line passing through a position where the cover-tape feeding device is provided.

The cover-tape feeding device 182 includes two conveyor belts 290, 291, a lever 292 as a reciprocative member, and a pinching mechanism 294. Each of the conveyor belts 290, 291 is an endless belt which is wound on two pulleys 295, 296 which are rotatably attached to the bracket 104. FIG. 9 shows the pulley 295 as a representative of the two pulleys 295, 296. The pulley 295 has three flanges 297 which are spaced from one another in an axial direction of the pulley 295. The three flanges 297 cooperate with one another to define two grooves in which the two conveyor belts 290, 291 are fitted such that each belt 290, 291 is movable relative to the pulley 295. The flanges 297 of the pulley 295 are bigger than those of the pulley 296. That is, the flanges 297 can guide the conveyor belts 290, 291, and radially outwardly extend over the respective portions of the belts 290, 291 wound around the pulley 295. On the other hand, the flanges of the pulley 296 that are small can guide the belts 290, 291 but do not radially outwardly extend over the respective portions of the belts 290, 291 wound around the pulley 296.

Figure 4:
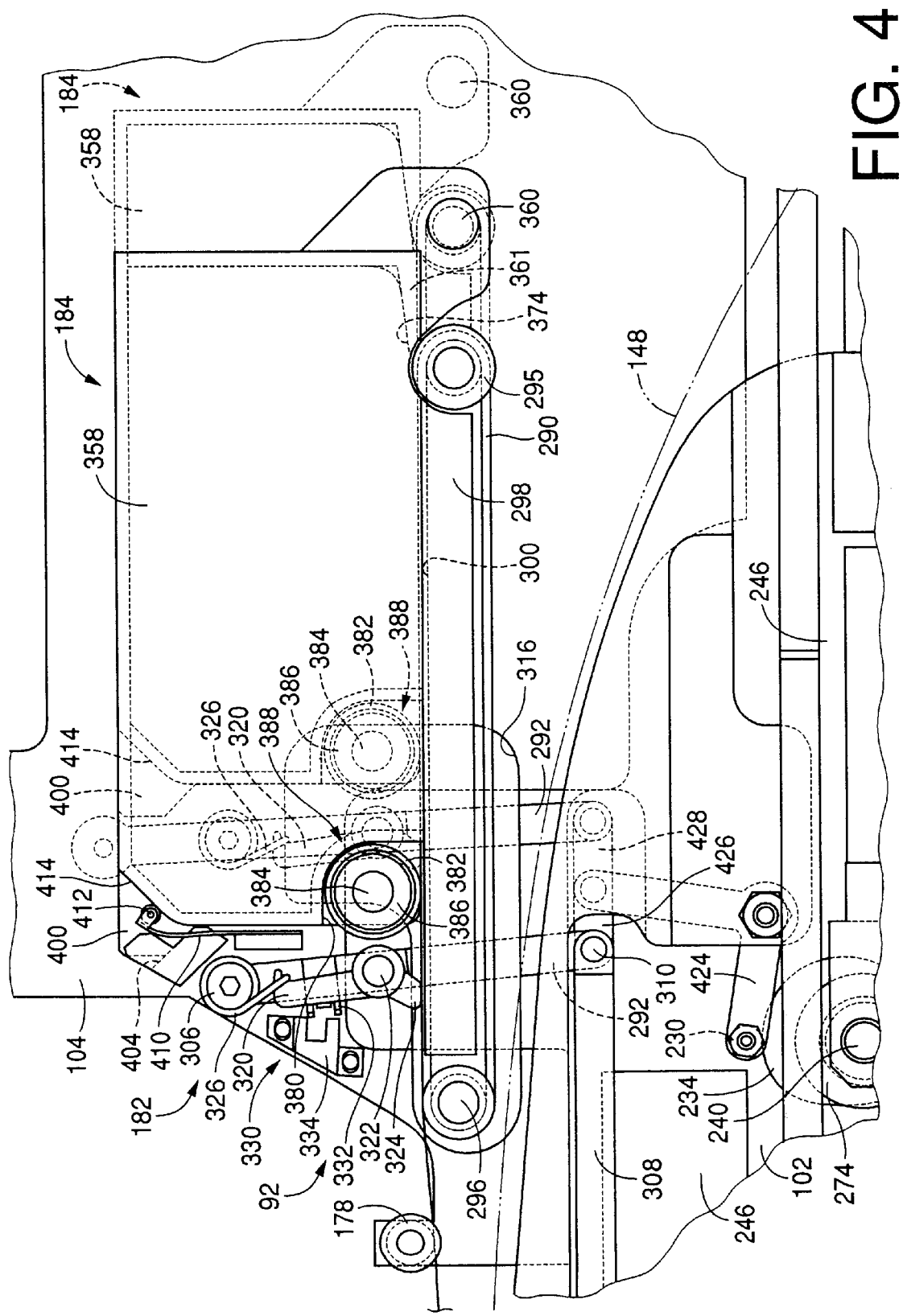
FIG. 4 is a partly cross-sectioned, front elevation view of a cover-tape feeding device of the EC feeder of FIG. 1.

A belt guide 298 is provided, on the bracket 104, between the two guide pulleys 295, 296. As shown in FIGS. 4 and 9, the belt guide 298 has a guide groove 300 as a guide portion which has a rectangular cross section and which is formed through the thickness of the guide 298 in the lengthwise direction thereof. The guide groove 300 has a width which allows the two belts 290, 291 to be fitted therein with a small space being left between the two belts 290, 291 in the widthwise direction of the groove 300. The belts 290, 291 are fitted in the guide groove 300 such that each belt 290, 291 is movable relative to the guide 298 in the lengthwise direction thereof and such that the two belts 290, 291 are prevented from being moved away from each other in the widthwise direction of the guide 298. All inner surfaces of the guide groove 300 (i.e., one bottom surface and two side surfaces) are coated with Teflon (commercial name), so that those surfaces have a low friction coefficient. Alternatively, the belt guide 298 itself may be formed of a material having a low friction coefficient such as Teflon.

As described above, each of the two conveyor belts 290, 291 is an endless belt which is wound on the two pulleys 295, 296. Accordingly, each belt 290, 291 includes upper and lower flat portions. Respective upper surfaces of the upper flat portions of the two belts 290, 291 are higher than the upper surface of the belt guide 298. The cover tape 146 which has been peeled from the EC accommodating tape 140 and has been guided by the guide pulley 178, is engaged with the pulley 296, and then is introduced onto the respective upper surfaces of the two belts 290, 291. That is, the cover tape 146 is supported on the two belts 290, 291. As shown in FIG. 9, the guide groove 300 is provided in a middle portion of the belt guide 298 in the widthwise direction thereof. Accordingly, the guide groove 300 is not aligned, in the widthwise direction thereof, with the two side portions 142 of the EC accommodating tape 140 and the groove 152 (FIG. 5) formed in the support member 102. Thus, the cover tape 146 supported on the belts 290, 291 hangs over the inner edge line of the inner belt 290, toward the bracket 104, and retracts inward from the outer edge line of the outer belt 291. Thus, the outer belt 291 includes an exposed portion which does not support the cover tape 146 being fed.

As shown in FIG. 4, an upper end portion of the lever 292 is pivotally attached to an axis member 306 fixed to the bracket 104. As shown in FIG. 9, the lever 292 is curved at its intermediate portion as seen in its lengthwise direction. A lower portion of the lever 292 is positioned in the plane in which the bracket 104 is positioned, and is pivotally connected to one end portion of a link 308 via a pin 310. The other end portion of the link 308 is pivotally connected to an arm portion 312 of the lever 224 via a pin 314. The arm portion 312 extends perpendicularly to not only a straight line connecting between the axis of rotation of the roller 230 attached to the lever 224 and the axis of pivotal motion of the link 220 (i.e., the axis line of the pin 228), and but also the axis of pivotal motion of the lever 224. The bracket 104 has a recess 316 (FIGS. 4 and 9) which prevents the bracket 104 from being interfered with by the lever 292.

The pinching mechanism 294 further includes a pinching claw 320 which is pivotally attached to the lever 292. The pinching claw 320 is pivotally attached via a pin 322 to an intermediate portion of the lever 292 between one end portion thereof supported by the axis member 306 and the other end portion thereof connected to the link 308. The pinching claw 320 includes an operative end portion 324 which is held in contact with the cover tape 146 and the outer conveyor belt 291. The operative portion 324 has a great width which assures that the operative portion 324 contacts the cover tape 146 except a portion thereof hanging over the inner edge line of the inner belt 290 and contacts the outer belt 291 including the exposed portion which does not support the cover tape 146.

The operative portion 324 is provided on an upstream side of a straight line connecting between the center of pivotal motion of the lever 292 and the center of pivotal motion of the claw 320, in a direction in which the cover tape 146 is fed (hereinafter, referred to as the "cover-tape-feed direction"). When the lever 292 is pivoted in its forward direction corresponding to the cover-tape-feed direction (i.e., counterclockwise in FIG. 3), the pinching claw 320 is pivoted relative to the lever 292 in a direction in which the pinching claw 320 approaches the cover tape 146. The pinching claw 320 is biased by a spring member 326 which is provided, as an example of a biasing device, between the axis member 306 and the claw 320, in a direction in which the operative portion 324 contacts the cover tape 146 on the conveyor belts 290, 291. Thus, the pinching claw 320 cooperates with the belt guide 298 to pinch the cover tape 146 and the belts 290, 291 supporting the tape 146. As shown in FIG. 9, the inner belt 290 and a portion of the outer belt 291 which supports the cover tape 146 are elastically deformed, so that the upper surface of the cover tape 146 becomes flush with the upper surface of the exposed portion of the outer belt 291 that does not support the tape 146. A portion of the belt guide 298 which cooperates with the pinching claw 320 to pinch the cover tape 146 and the belts 290, 291, provides another or second pinching claw which cooperates with the first pinching claw 320 to provide the pinching mechanism 294.

Figure 11:
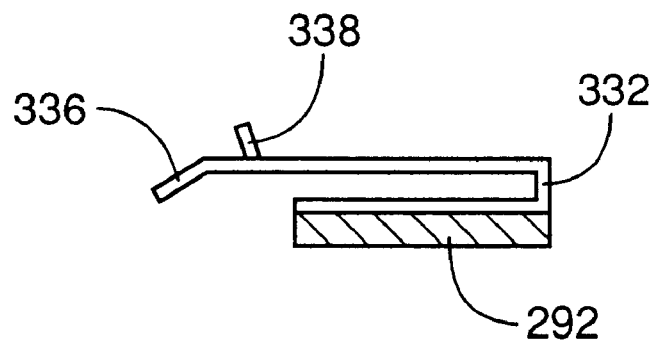
FIG. 11 is a bottom view of a latch member of a keeping-away device as an element of the cover-tape feeding device of FIG. 4.
Figure 12:
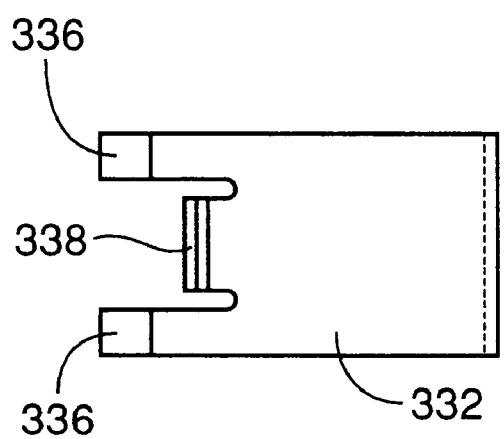
FIG. 12 is an elevation view of the latch member of FIG. 11.

A keeping-away device 330 can keep the pinching claw 320 away from the cover tape 146 against the biasing force of the spring member 326. The separate-state keeping device 330 includes a latch member 332 and a release member 334. The latch member 332 is formed of a leaf spring as an example of a spring member. As shown in FIG. 11, the latch member 332 is fixed to the lever 292. The latch member 332 is first bent at its downstream-side end as viewed in the direction of forward movement of the lever 292, so as to be directed away from the lever 292, and is second bent so as to extend upstream in the same direction and parallel to the lever 292.

The latch member 332 includes an extension portion which extends over an upstream-side end of the lever 292 as viewed in the same direction, and the extension portion includes a pair of releasing portions 336 and a keeping portion 338. Each of the two releasing portions 336 is inclined relative to the plane of the lever 292 such that the distance between each portion 336 and the lever 292 as measured in a direction perpendicular to the plane of the lever 292 increases in the direction of forward movement of the lever 292. The keeping portion 338 is provided between the two releasing portions 336, and is inclined relative to the plane of the lever 292 such that the distance between the portion 338 and the lever 292 as measured in the perpendicular direction decreases in the direction of forward movement of the lever 292.

The release member 334 is fixed to the bracket 104. As shown in FIG. 17B, the release member 334 includes a pair of releasing portions 340 which cooperate with the bracket 104 to define respective spaces which the two releasing portions 336 of the latch member 332 are allowed to enter, respectively; and a recess 342 which is provided between the two releasing portions 340 and which the keeping portion 338 of the latch member 332 is allowed to enter.

Figure 13:
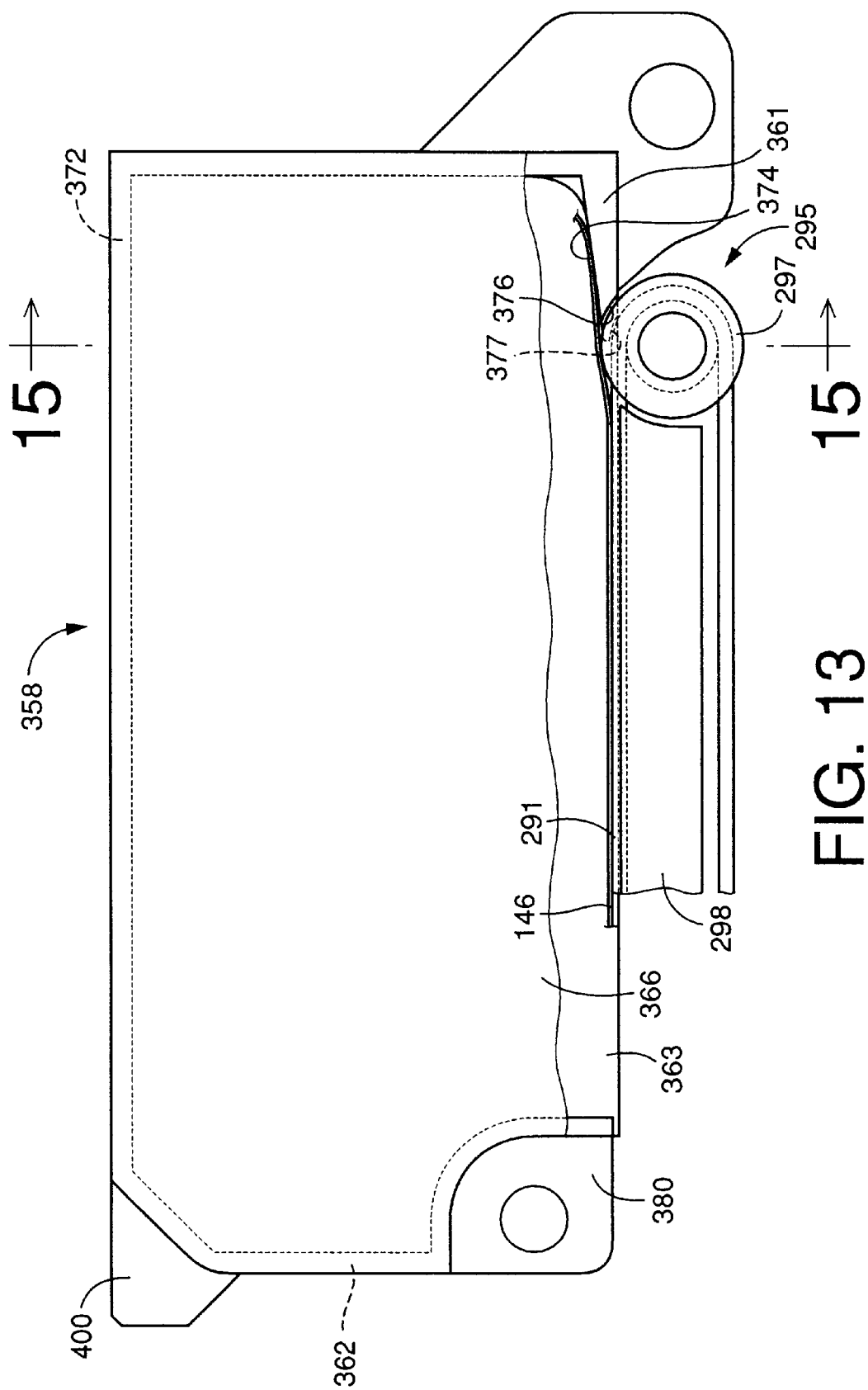
FIG. 13 is a front elevation view of a tape collecting box as an element of the cover-tape feeding device of FIG. 4.
Figure 14:
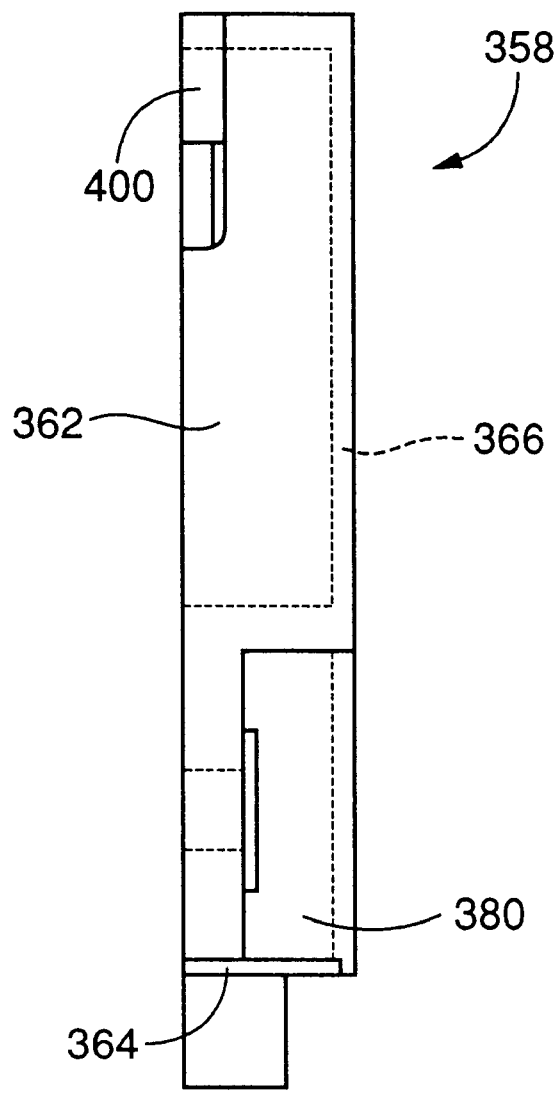
FIG. 14 is a left-hand elevation view of the tape collecting box of FIG. 13.

As shown in FIG. 4, the cover-tape collecting box 184 includes a box-forming member 358 which is pivotally attached via an axis member 360 to a portion of the bracket 104 on the downstream side of the lever 292 as viewed in the cover-tape-feed direction. The axis line of the axis member 360 is positioned in the plane in which the respective axis lines of the pair of pulleys 295, 296 are positioned, and is parallel to those of the pulleys 295, 296. As shown in FIG. 13, the box-forming member 358 is provided by a container-like member having a rectangular cross section. The member 358 has a bottom wall 361 only at its downstream-side end portion as viewed in the cover-tape-feed direction. Thus, the member 358 widely opens downward. In addition, the member 358 fully opens laterally toward the bracket 104. As shown in FIG. 14, the member 358 has, at a lower end of a front wall 362 thereof, an opening 364 which the cover tape 146 and the conveyor belts 290, 291 are allowed to enter.

Figure 15:
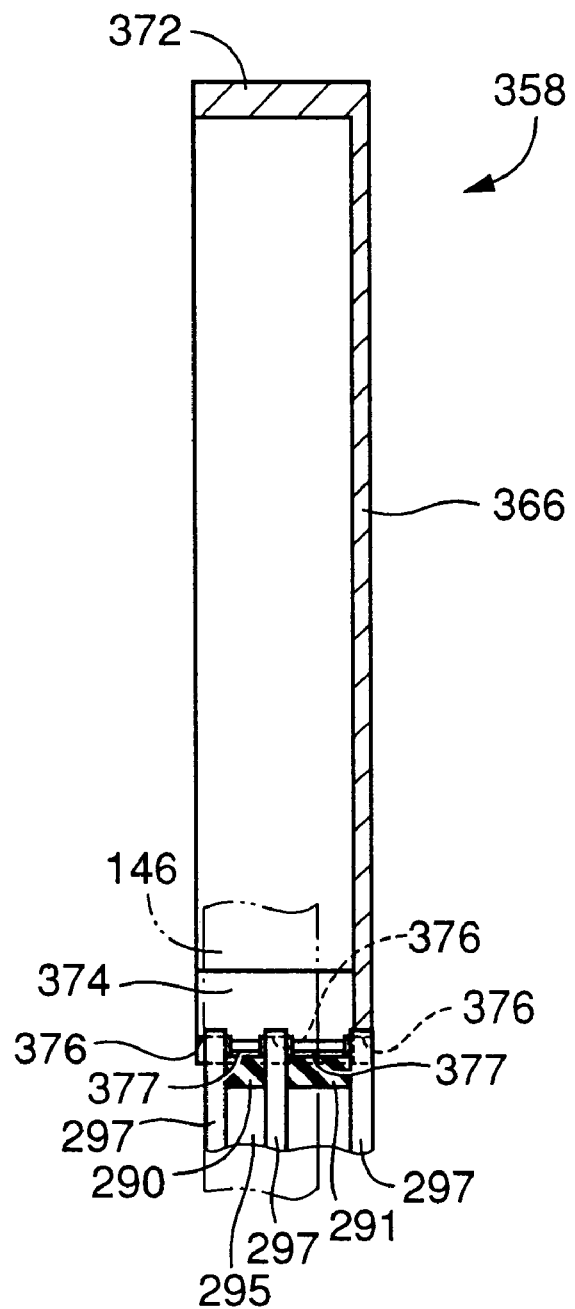
FIG. 15 is a cross-sectioned, elevation view of the tape collecting box of FIG. 13, taken along line 15—15.

The bottom wall 361 of the box-forming member 368 has an inclined inner surface 374 which is inclined such that the distance between the surface 374 and a top wall 372 decreases in the cover-tape-feed direction and which functions as a guide surface. In addition, as shown in FIGS. 13 and 15, the member 358 has three recesses 376 one of which ranges from a front end portion of the bottom wall 361 (i.e., an upstream-side portion of the same 361 in the cover-tape-feed direction) to a side wall 366 and all of which prevent the member 358 from interfering with the three flanges 276 of the pulley 295. In addition, the member 358 has additional recesses 377 which are formed adjacent to the recesses 376 in the bottom wall 361 and which prevent the member 358 from interfering with the conveyor belts 290, 291.

Figure 10:
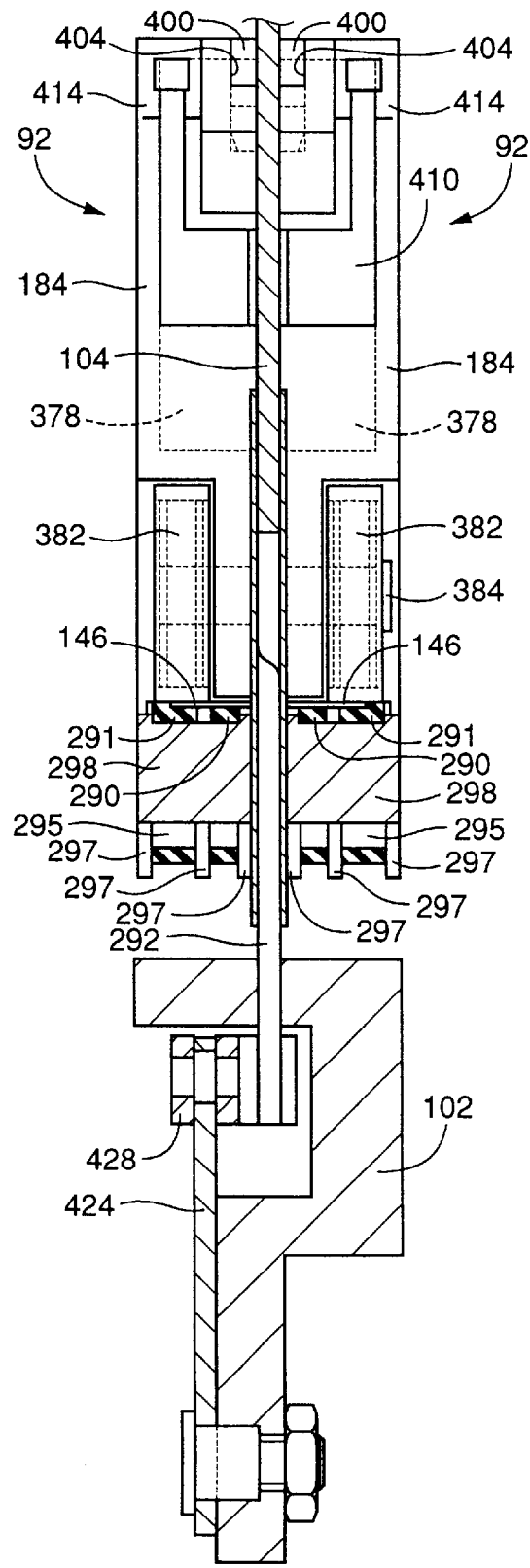
FIG. 10 is a cross-sectioned, elevation view of the pair of EC feeders of FIG. 2 taken along a line passing through a position where a tape collecting box is connected to a link.

As shown in FIGS. 4 and 10, the box-forming member 358 which opens laterally toward the bracket 104, is closed by the bracket 104. That is, the member 358 cooperates with the bracket 104 to provide the cover-tape collecting box 184 having a tape collecting chamber 378. The member 358 is pivotable to a tape-collect position where the member 358 stores the cover tape 146 and to a tape-remove position, indicated in two-dot chain lines in FIG. 2, where the member 358 takes an upright position, a front portion thereof projects upward over the bracket 104, and the tape-collecting chamber 378 is partly exposed through the side opening and where the operator is allowed to remove the collected cover tape 146 from the member 358. Thus, it can be said that the box-forming member 358 functions as both a tape-collecting-chamber defining member and a tape-collecting-chamber defining container.

In the state in which the box-forming member 358 is positioned at its tape-collect position, the member 358 covers the respective upper portions of the conveyor belts 290, 291 that project upward over the guide groove 300. Thus, the belts 290, 291 close the opening 363 of the member 358, and accordingly function as if they were a portion of the bottom wall of the member 358. Neither of the side wall 366 and the bottom wall 361 of the member 358 can contact the belt guide 298, that is, a small space is provided. A lower end of the side wall 366 is positioned outside the upper end portion of the conveyor belt 291, and prevents the cover tape 146 and the belt 291 from coming out of the tape collecting chamber 378.

Although the upper end portions of the flanges 297 of the pulley 295 and the upper end portions of the conveyor belts 290, 291 that project upward over the belt guide 298 are positioned inside the box-forming member 358, the recesses 376 formed in the bottom wall 361 and the side wall 366 prevent those walls 361, 366 from interfering with the flanges 297, and the recesses 377 prevent the bottom wall 361 from interfering with the belts 290, 291. In addition, respective portions of the guide surface 374 of the bottom wall 361 that correspond to the two belts 290, 291 extend into the two spaces between the three flanges 297. A front end portion of the guide surface 374 (i.e., an upstream-side end portion of the same 374 in the cover-tape-feed direction) is positioned below the upper ends of respective outer circumferential surfaces of the flanges 297 of the pulley 295.

As shown in FIG. 4, the box-forming member 358 includes, in a lower portion of the front wall 362, a recessed portion 380 which opens on one side of the member 358 opposite to the other side thereof on which the bracket 104 is provided. A roller 382 is attached via an axis member 384 to the recessed portion 380, such that the roller 382 is rotatable about a horizontal axis line which is spaced from the horizontal, upper flat portions of the conveyor belts 290, 291 and is perpendicular to those flat portions as viewed in a vertical direction. As shown in FIG. 10, the roller 382 is provided such that the roller 382 contacts a portion of the cover tape 146 that is supported on the conveyor belt 291, and a portion of the belt 291 that does not support the tape 146.

A one-way clutch 386 as an example of a reverse-rotation preventing device is provided between the roller 382 and the axis member 384. The one-way clutch 386 permits the roller 382 to be rotated in a direction which ensures that a portion of the roller 382 that contacts the cover tape 146 is moved in one direction corresponding to the direction of forward movement of the lever 292. However, the clutch 386 prevents the roller 382 from being rotated in the reverse direction. An outer circumferential surface of the roller 382 is formed of a material having a great friction coefficient, e.g., rubber. In the state in which the box-forming member 358 is positioned at the tape-collect position, the roller 382 is pressed against the cover tape 146 and the conveyor belt 291. Thus, a small space is left between the bottom surface of the member 358 (i.e., the respective lower surfaces of the bottom wall 361 and the side wall 366) and the upper surface of the belt guide 298. The roller 382 and the one-way clutch 386 cooperate with each other to provide a tape-return preventing device 388.

The box-forming member 358 has, on an upper portion of an outer surface of the front wall 362, an operable projection 400 as an operator's operable portion. The projection 400 has a plate-like configuration. As shown in FIG. 10, the projection 400 projects frontward from one of widthwise opposite end portions of the member 358 that is on the side of the bracket 104. The bracket 104 has a recessed portion 404. With the projection 400 being fitted in the recessed portion 404, the member 358 is positioned relative to the common portion 100 in the widthwise direction of the member 358.

The bracket 104 is provided with a moving-up preventing member 410 which prevents the box-forming member 358 from moving up. The preventing member 410 is provided by a leaf spring, and is fixed at its lower end portion to the bracket 104. The other end portion of the preventing member 410 is curved obliquely toward the member 358, and supports at its free end an engaging roller 412 as a rolling member as an example of an engaging member such that the roller 412 is rotatable. The engaging roller 412 engages an engaging surface 414 provided on the upper portion of the front wall 362 of the member 358, and biases the member 358 toward the belt guide 298. The engaging surface 414 is an inclined surface which is inclined rearward and upward, i.e., frontward and downward. Because of the effect of inclination of the engaging surface 414, the moving-up preventing member 410 biases the box-forming member 358 downward. Thus, the roller 382 is pressed on the cover tape 146 and the conveyor belt 291, and the member 358 is prevented from moving up due to, e.g., vibration. The preventing member 410 functions as a pressing member. Since the roller 382 is pressed against the tape 146 and the belt 291, frictional forces are produced between the roller 382 and the tape 146 and between the roller 382 and the belt 291.

While one of the pair of EC feeders 92 has been described, the other EC feeder 92 also has a carrier-tape feeding device 180, a cover-tape feeding device 182, and a cover-tape collecting box 184 which have substantially the same constructions as those of the above-described corresponding devices 180, 182, 184 of the one EC feeder 92. However, the DC motor 246 of the carrier-tape feeding device 180 of the other EC feeder 92 is provided on an upstream side of the DC motor of the carrier-tape feeding device 180 of the one EC feeder 92 as viewed in the carrier-tape-feed direction. If the two DC motors 246 would be provided at the same position in the carrier-tape-feed direction, the total width of the pair of EC feeders 92 would be adversely increased. In addition, the worm of the other EC feeder 92 is meshed with the worm wheel thereof in a direction opposite to the direction in which the worm 244 of the one EC feeder 92 is meshed with the worm wheel 242 thereof. Therefore, the direction of rotation of the plate cam 234 of the other EC feeder 92 is opposite to that of the plate cam 234 of the one EC feeder 92.

Moreover, the lever 292, the pinching mechanism 294, and the cover-tape collecting box 184 of the cover-tape feeding device 182 of the other EC feeder 92 are provided on a downstream side of the counterparts 292, 294, 184 of the cover-tape feeding device 182 of the one EC feeder 92 as viewed in the cover-tape-feed direction, so as to prevent interferences of those elements. Therefore, in the carrier-tape feeding device 180 of the other EC feeder 92, a lever 422 which is pivotally connected to the pivotable plate 200 via a link 420 (FIG. 7), supports no roller, and a roller 230 is rotatably attached to a second lever 424 which is pivotally attached to the support member 102. The two levers 422, 424 are connected to each other via a second link 426.

A third link 428 is pivotally connected to the second link 426, and a lower end portion of the lever 292 of the pinching mechanism 294 of the other EC feeder 92 is pivotally connected to the third link 428. The length of the arm portion 312 connecting between the lever 224 and the link 308 of the carrier-tape feeding device 180 of the one EC feeder 92 is different from the distance between the axis of pivotal motion of the lever 422 and the axis of pivotal motion of the link 426 relative to the lever 422. Therefore, even if the respective levers 292 of the two cover-tape feeding devices 182 are pivoted by the same angle about the same axis line, the two cover tapes 146 may be fed by different feeding pitches, respectively. However, the distance between the axis of pivotal motion of the lever 292 relative to the bracket 104 and that of the same 292 relative to the link 428 in the other cover-tape feeding device 182 is made larger than that between the axis of pivotal motion of the lever 292 relative to the bracket 104 and that of the same 292 relative to the link 308 in the one cover-tape feeding device 182, so that the respective pinching (tape-feeding) claws 320 of the two cover-tape feeding devices 182 are moved at the same feeding stroke. Thus, the two cover tapes 146 are fed at the same feeding pitch by the two cover-tape feeding devices 182.

In the other EC feeder 92, the groove 152 is provided in the support member 102 such that the groove 152 is away from the bracket 104 in the widthwise direction of the member 102. The cover tape 146 peeled from the EC accommodating tape 140 is guided by the guide pulley 178 and, as indicated in two-dot chain lines in FIG. 9, is curved toward the bracket 104. Thus, the tape 146 is placed on the conveyor belts 290, 291 such that the inner end portion of the tape 146 on the side of the bracket 104 projects over the inner edge line of the inner belt 290 toward the bracket 104, and such that the outer end portion of the outer belt 291 does not support the tape 146.

The other EC feeder 92 additionally includes a keeping-away device and a moving-up preventing member which have substantially the same constructions as those of the counterparts 330, 410 of the one EC feeder 92. However, those elements are omitted from the drawings, for easier understanding of the same.

Figure 16:
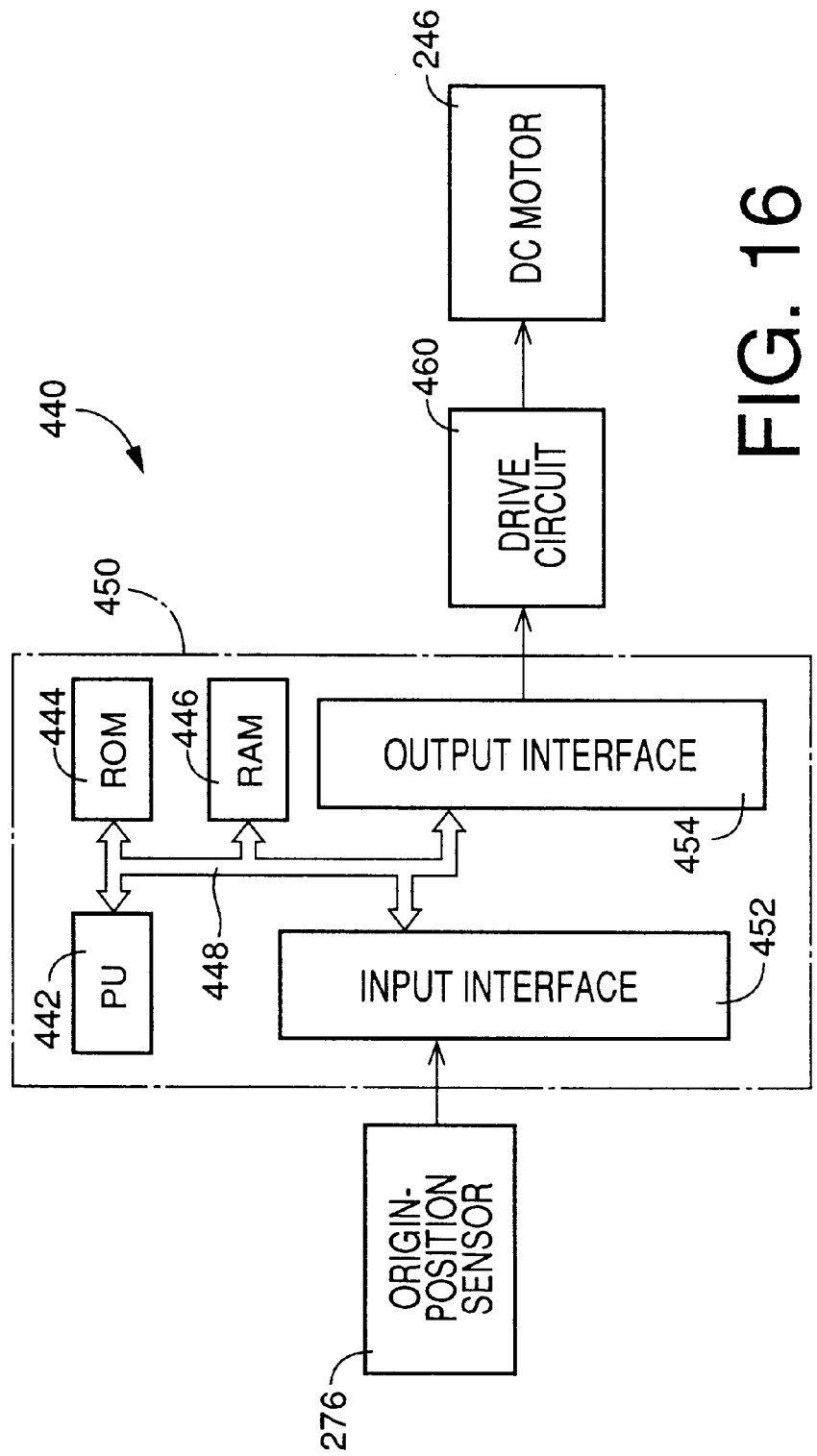
FIG. 16 is a diagrammatic view of a relevant portion of a control device of the EC mounting system of FIG. 1.

Each of the two EC feeders 92 has a control device 440 illustrated in FIG. 16. The control device 440 is essentially provided by a computer 450 including a processing unit (PU) 442, a read only memory (ROM) 444, a random access memory (RAM) 446, and bus 448 for connecting the elements 442, 444, 446 to one another. The origin-position sensor 276 is connected to the bus 446 via an input interface 452. The bus 448 is connected to an output interface 454 which in turn is connected via a drive circuit 460 to the DC motor 246. The ROM 444 stores various control programs which are needed for carrying out various operations including an operation for supplying the ECs 78. The control device 440 communicates, i.e., sends and receives commands, information, data, or the like to and from a control device (not shown) which controls the PCB conveyor 14, the EC transferring and mounting apparatuses 20, 22, and others.

Next, there will be described the operation of the EC mounting system 10 constructed as described above.

The two EC transferring and mounting apparatuses 20, 22 alternately mounts ECs 78 on a PCB 32 positioned and supported by each one of the two main conveyors 24, 26. That is, the two apparatuses 20, 22 cooperate with each other to mount, on each PCB 32, all the ECs 78 to be mounted thereon by the present EC mounting system 10. While ECs 78 are mounted on a PCB 32 positioned and supported by one of the two main conveyors 24, 26, another PCB 32 is carried out of the other main conveyor and the next PCB 32 is carried in onto the other main conveyor and is positioned and supported by the same. On the other main conveyor, the new PCB 32 waits for ECs 78 to be mounted thereon. After all the ECs 78 have been mounted on the PCB 32 supported by the one main conveyor, the PCB 32 is carried out by the carry-out conveyor 30, and the two EC transferring and mounting apparatuses 20, 22 start mounting ECs 78 on the PCB 32 waiting on the other main conveyor.

The two EC transferring and mounting apparatuses 20, 22 receive ECs 78 from the corresponding EC supplying apparatuses 16, 18, respectively, but do not receive any ECs 78 from the other apparatuses 18, 16, respectively. When each of the two apparatuses 20, 22 receives ECs 78, the plurality of EC suckers 76 are sequentially positioned at the EC-suck-and-mount position by the intermittent rotation of the intermittent-rotation body 68, 70, and each EC sucker 76 is moved to a position above the EC-supply portion of an appropriate EC feeder 92 by the movement of the X-Y robot 62, 64. Thus, the EC sucker 76 picks up an EC 78 from the EC feeder 92.

After all the EC suckers 76 of the EC mounting head 50, 52 have picked up respective ECs 78 from the EC feeders 92, the head 50, 52 is moved by the X-Y robot 62, 64 to respective positions above the PCB 32 to mount the ECs 78 thereon. More specifically described, the plurality of EC suckers 76 are sequentially moved to, and positioned at, the EC-suck-and-mount position by the intermittent rotation of the intermittent-rotation body 68, 70, and each of the EC suckers 76 is moved to a position above a corresponding EC-mount place on the PCB 32 by the movement of the X-Y robot 62, 64, so as to mount the EC 78 on the EC-mount place of the PCB 32.

A plurality of EC suckers 76 may pick up respective ECs 78 from a single EC feeder 92, or may pick up respective ECs 78 from a plurality of EC feeders 92, respectively. The former case means that the single EC feeder 92 successively supplies the plurality of ECs 78. The following description relates to one of the pair of EC feeders 92 shown in FIGS. 5 and 6, as a representative of the two feeders 92. That is, the carrier-tape feeding operation, cover-tape peeling operation, and other operations of one EC feeder 92 will be described below. The other EC feeder 92 carries out those operations in similar manners.

The EC feeder 92 waits in the state in which the feeder 92 has finished its preparation for the feeding of the EC carrier tape 148. In this state, the DC motor 246 is not operated, and the roller 230 is engaged with the position-keep surface 254 of the plate cam 234. In addition, the leading EC-accommodating portion 144 of the EC-accommodating tape 140, positioned at the EC-pick-up position, is empty because the EC 78 has been picked up by an appropriate EC sucker 78. The EC sucker 78 is moved to a position above the EC-pick-up position by the intermittent rotation of the intermittent-rotation body 68, 70 and the movement of the X-Y robot 62, 64, and is moved downward to suck the EC 78 and pick up the EC 78 from the portion 144. The DC motor 246 is started at an appropriate timing with respect to the picking up of the EC 78 by the EC sucker 76. Thus, the EC carrier tape 148 is fed and the leading EC 78 is moved to the EC-pick-up position where the EC 78 is picked up by the next EC sucker 76.

When the DC motor 246 is started, the plate cam 234 is rotated with the worm 244 and the worm wheel 242. Since the roller 230 is engaged with the position-keep surface 254 when the DC motor 246 is started, the roller 230 is kept still for a certain time period just after the DC motor 246 is started, though the plate cam 234 is rotated. During this time period, the rotation speed of the plate cam 234 is increased up to a constant speed, and then the roller 230 is brought into engagement with the carrier-tape-feed surface 250 of the cam 234. Thus, the pivotable plate 200 is pivoted in its forward direction. Consequently the ratchet wheel 196 and the sprocket 192 are rotated and the EC carrier tape 148 is fed, so that one EC 78 is positioned at the EC-pick-up position. The lever ratio of the lever 224 and the link 220 (the lever ratio of the link 420 and the levers 422, 424) is so determined that one carrier-tape feeding operation results in feeding the EC carrier tape 148 by the same distance as the predetermined pitch (interval of distance) at which the plurality of EC-accommodating portions 144 are provided on the EC-accommodating tape 140.

The accelerating surface 256 and the decelerating surface 258 of the carrier-tape-feed surface 250 are so formed that the EC carrier tape 148 is smoothly accelerated from the speed of zero and is smoothly decelerated to the speed of zero, respectively. Thus, the vibration produced when the feeding of the tape 148 is started and stopped is minimized. Therefore, though the leading one of a plurality of ECs 78 from which the cover tape 146 has been peeled is moved to the EC-pick-up position while being not covered by the cover tape 146 nor the cover member 160, the leading EC 78 does not jump out of the EC-accommodating portion 144 nor stand up in the portion 144 due to the vibration. Thus, each EC sucker 76 can surely suck each EC 78. In the case where one EC feeder 92 successively supplies a plurality of ECs 78 to a plurality of EC suckers 76, the EC feeder 92 needs to feed the ECs 78 one by one to the EC-pick-up position at an appropriate time interval substantially equal to that at which the EC suckers 76 pick up the ECs 78, respectively, at the EC-suck-and-mount position. Thus, the above time interval is limited to a short time. However, since the speed of feeding of the EC carrier tape 148 can be freely controlled by using the plate cam 234, the tape 148 can be fed with the least vibration, even though the time interval is limited to a short time.

After the feeding of the EC carrier tape 148 has ended, the roller 230 is brought into engagement with the feed-prepare surface 252 of the plate cam 234, so that the pivotable plate 200 is pivoted in the backward direction and the ratchet pawl 202 moves over a predetermined number of teeth of the ratchet wheel 196. Thus, the EC feeder 92 prepares for the next feeding of the EC carrier tape 148. Since the backward rotation of the ratchet wheel 196 is reliably inhibited by the stopper lever 210, the sprocket 192 and the ratchet wheel 196 are not rotated in the backward direction when the ratchet pawl 202 moves over the teeth of the ratchet wheel 196. That is, the leading EC 78 is kept positioned at the EC-pick-up position and accordingly the EC sucker 76 can reliably pick up the EC 78. After the next feeding of the EC carrier tape 148 has been prepared, the roller 230 is brought into engagement with the position-keep surface 254, and the origin position of the plate cam 234 is detected by the origin-position sensor 276, which outputs a detection signal indicating that the sensor 276 has detected the origin position of the plate cam 234. The detection signal is utilized for stopping the DC motor 246, which waits for the next operation. The DC motor 246 is provided by a common electric rotary motor which is not accurately controllable with respect to its rotation amount or angle. However, it is just required that, after the preparation of the next feeding of the tape 148, the DC motor 246 be stopped in the state in which the roller 230 is engaged with the position-keep surface 254 and the pivotable plate 200 has not been pivoted yet. Thus, the accuracy of detection of the origin position of the plate cam 234 or the accuracy of stopping of the DC motor 246 does not have to be so high. Thus, the origin position of the EC feeder 92 can be detected with ease and at low cost, and the control of the DC motor 246 can be performed with ease and at low cost.

When the EC carrier tape 148 is fed, the cover-tape feeding device 182 feeds the cover tape 146 while peeling the tape 146 from the EC accommodating tape 140. In the state in which the preparation of the next feeding of the EC carrier tape 148 has ended and the EC feeder 92 waits for the next feeding of the tape 148, the two releasing portions 336 of the latch member 332 are engaged with the two releasing portions 340 of the release member 334, respectively, and the keeping portion 338 is not engaged with the pinching claw 320. Therefore, the pinching claw 320 is kept rotatable relative to the lever 292 and is biased by the spring member 326, so that the pinching claw 320 is held in pressed contact with the cover tape 146 and the conveyor belt 291.

When the DC motor 246 is started to feed the EC carrier tape 148, the lever 292 is moved in its forward direction via the arm portion 312 of the lever 224 and the link 308. The pinching claw 320 is provided such that when the operative portion 324 of the claw 320 is moved relative to the lever 292 in the forward direction of the lever 292, the claw 320 is moved in a direction in which the claw 320 approaches the cover tape 146. Thus, when the pinching claw 320 is moved with the lever 292 in the forward direction, the claw 320 is not forced to engage the cover tape 146. However, the pinching claw 320 is biased by the spring member 326 toward the cover tape 146 and the conveyor belts 290, 291, so that the claw 320 directly contacts and moves those elements 146, 290, 291. Since the friction coefficient of the belt 291 is high and the friction coefficient of the inner surfaces of the guide groove 300 of the belt guide 298 is low, a greater frictional force is produced between the operative portion 324 and the belt 291 than that produced between the belt 291 and the groove 300. In addition, though the cover tape 146 has a low friction coefficient, the tape 146 cuts into the belts 290, 291 under the pinching claw 320. Thus, frictional forces great enough to move the cover tape 146 are produced between the tape 146 and the claw 320 and between the tape 146 and the belts 290, 291.

The cover tape 146 pinched by the pinching claw 320 and the conveyor belt 291 is moved and fed with those elements 320, 291. When the belt 291 is moved, the pulley 296 is rotated and accordingly the belt 290 is moved, so that the cover tape 146 is fed. When the cover tape 146 is peeled from the EC accommodating tape 140, the tape 146 receives a resistance of the tape 140. However, since the frictional forces produced between the cover tape 146 and the pinching claw 320 and between the tape 146 and the conveyor belts 290, 291 are greater than the resistance, the tape 146 is not returned. During each carrier-tape feeding operation, the lever 292 and the pinching claw 320 cooperate with each other to feed the cover tape 146 by a distance slightly greater than the length of the EC carrier tape 148 fed by one carrier-tape feeding operation of the carrier-tape feeding device 180. Thus, the length of the cover tape 146 that corresponds to a predetermined pitch is surely peeled from the EC accommodating tape 140 and is fed forward. In addition, a portion of the roller 382 that contacts the cover tape 146 is moved in the forward direction of the lever 292. Thus, the roller 382 allows the cover tape 146 to be fed forward.

The lever 292 is designed such that the lever 292 is pivoted by the same angle in each of forward and backward directions from a perpendicular line which is drawn from the axis line of the axis member 306 to the belt guide 298. When the lever 292 is pivoted, the axis line of pivotal motion of the pinching claw 320 is moved symmetrically with respect to the above perpendicular line. Therefore, the respective long arm portions of the pinching claw 320 taking its feed-start position shown in FIG. 17A and the same 320 taking its feed-end position shown in FIG. 17B are parallel to each other. In contrast, since the lever 292 is pivoted about the axis line of the axis member 306, the pinching claw 320 is pivoted relative to the lever 292 as shown in FIG. 17B.

When the lever 292 is pivoted, the axis line of pivotal motion of the pinching claw 320 relative to the lever 292 is pivoted about the axis line of pivotal motion of the lever 292. Therefore, a lower end portion of the operative portion 324 of the claw 320 slightly cuts into the cover tape 146, and accordingly the movement of the operative portion 324 is resisted. Thus, the length of the cover tape 146 which is fed by the pinching claw 320 might be smaller than that which would be fed by a pinching claw which would be moved in a direction parallel to the belt guide 298. However, when the lever 292 is pivoted over the above-mentioned perpendicular line, the amount of cutting of the operative portion 324 into the tape 146 starts decreasing, and the amount of feeding of the tape 146 starts increasing. Thus, in fact, the length of the cover tape 146 which is fed by the pinching claw 320 can be made equal to that which would be fed by a pinching claw which would be moved from the feed-start position to the feed-end position in a direction parallel to the belt guide 298. The speed of pivotal motion of the claw 320 relative to the lever 292 that is measured before the lever 292 is pivoted over the above-mentioned perpendicular line, is slightly lower than that measured after.

When the pinching claw 320 is pivoted relative to the lever 292 and accordingly the angular phase of the claw 320 relative to the lever 292 is changed, the latch member 332 is moved relative to the claw 320 in a direction in which the keeping portion 338 of the member 332 is moved away from the back surface of the claw 320. The one-pitch feeding of the cover tape 146 ends when the lever 292 is pivoted to a position just before the end of its forward movement and, when the lever 292 is further pivoted toward the end of its forward movement, the keeping portion 338 of the latch claw 332 is disengaged from the back surface of the pinching claw 320 and is engaged with the upstream-side edge portion of the claw 320 as viewed in the forward direction of the lever 292.

When the lever 292 is further pivoted toward the end of its forward movement, the keeping portion 338 slides on the pinching claw 320 as the angular phase of the claw 320 relative to the lever 292 changes. Thus, the keeping portion 338 slowly emerges on one side of the pinching claw 320 opposite to the other side on which the lever 292 is provided. The angle of inclination of the keeping portion 338 is so determined that the keeping portion 338 slides on the pinching claw 320 as the relative angular phase between the claw 320 and the lever 292 changes and that the keeping member 338 does not allow the pinching claw 320 to be moved back thereover because of the biasing force of the spring member 326. Thus, the keeping portion 338 is never separated from the pinching claw 320 and the claw 320 is kept engaged with the lever 292 via the latch member 332.

After the cover tape 146 has been fed by one pitch, the pinching claw 320 slides on the tape 146 and accordingly no more tape 146 is fed. After the EC carrier tape 148 has been fed by one pitch and the one-pitch length of the cover tape 146 has been peeled off, no more cover tape 146 is peeled from the EC accommodating tape 140 because the cover tape 146 is engaged with, and stopped by, a slit (not shown) formed in the cover member 160.

When the carrier-tape feeding device 180 prepares for the next feeding of the EC carrier tape 148, the lever is pivoted in the backward direction. At the beginning, the keeping portion 338 is engaged with the pinching claw 320 and accordingly the claw 320 is pivoted with the lever 292. The operative portion 324 of the claw 320 is prevented from being engaged with the cover tape 146 due to the biasing action of the spring member 326, because the keeping portion 338 is engaged with the claw 320. In addition, since the operative portion 324 is positioned on the downstream side of the above-mentioned perpendicular line as viewed in the backward direction of the lever 292, the operative portion 324 is kept away from, and not engaged with, the cover tape 146, as indicated in two-dot chain lines in FIG. 17B, when the lever 292 is pivoted in its backward direction. Thus, the operative portion 324 is moved toward its feed-start position while not applying any forces to the cover tape 146 in a returning direction opposite to the cover-tape-feed direction. That is, when the pinching claw 320 is moved back with the lever 292, the claw 320 does not cut into the cover tape 146 or draw the tape 146 out of the tape collecting box 184.

Since the keeping portion 388 is inclined relative to the pinching claw 320, and is kept engaged with the claw 320 because of sliding relative to the claw 320 when the lever 292 is further pivoted toward the end of its forward movement after the engaging portion 338 has been engaged with the claw 320, the operative portion 324 is prevented from cutting into the cover tape 146. If the keeping portion could not be kept engaged with the claw 320 in the above case, the claw 320 would be separated from the engaging portion 338 when the lever 292 is further pivoted toward the end of its forward movement after the engaging portion 338 has been engaged with the claw 320, and the claw 320 would cut into the tape 146 because of the biasing force of the spring member 326 when the lever 292 is moved in its backward direction. That is, the claw 320 could not be moved back to the feed-start position. In contrast, since in the present embodiment the engaging portion 338 is engaged with the claw 320 when the lever 292 starts its backward movement, the operative portion 324 is prevented from cutting into the tape 146 and the claw 320 can be moved back with the lever 292.

As the lever 292 is pivoted, the two releasing portions 336 of the latch member 332 enter the respective spaces between the two releasing portions 340 of the release member 340 and the bracket 104, so that the latch member 332 is elastically deformed toward the lever 292 and accordingly the keeping portion 338 is disengaged from the pinching claw 320. Consequently the keeping portion 338 is brought into the state in which the keeping portion 338 is opposed to the pinching claw 320 as illustrated in FIG. 17A. More specifically described, the keeping portion 338 is disengaged from the pinching claw 320 in the vicinity of the end of the backward movement of the lever 292. If the lever 292 reaches the end of its backward movement before the pinching claw 320 is contacted with the cover tape 146 and the conveyor belt 291 by the biasing action of the spring member 326, the pinching claw 320 is stopped in contact with the cover tape 146 and the outer belt 291.

When the lever 292 is pivoted back and the pinching claw 320 is moved back, the roller 382 attached to the tape collecting box 184 is prevented by the one-way clutch 384 from being rotated in the direction in which the portion of the roller 382 which contacts the tape 146 is moved in the backward direction of the lever 292. That is, the roller 382 is not rotated in any directions and the cover tape 146 is prevented by the frictional force produced between the outer circumferential surface of the roller 382 and the cover tape 146 and the outer belt 291, from being moved in the direction opposite to the cover-tape-feed direction out of the tape collecting box 184.

If the lever 292 has not reached the end of its backward movement when the pinching claw 320 is contacted by the biasing action of the spring member with the cover tape 146 and the conveyor belt 291, the operative portion 324 of the claw 320 contacts and engages the cover tape 146 by the biasing action of the spring member 326. Thus, the cover tape 146 receives a force which moves the tape 146 back out of the tape collecting box 184.

In the above case, the roller 230 is held in contact with the cover tape 146 and the conveyor belt 291, whereas the pinching claw 320 applies, to the cover tape 146, a force which moves the tape 146 back in the state in which the claw 320 is forced to engage the tape 146 and the belt 291. Therefore, the above force is greater than the sum of the frictional forces produced between the roller 230 and the tape 146 and between the roller 230 and the belt 291. In addition, the friction coefficient of the outer circumferential surface of the roller 230 and the biasing force to press the roller 230 on the tape 146 and the belt 291 (i.e., the biasing force of the moving-up preventing member 410 to bias the tape collecting box 184 toward the belt guide 298) are so determined that the sum of the above frictional forces is smaller than the tensile strength of the cover tape 146. Therefore, if the lever 292 is slightly pivoted toward the end of its backward movement in the state in which the keeping portion 338 is disengaged from the pinching claw 320 and the operative portion 324 is allowed to engage the cover tape 146, the tape 146 is slightly returned to allow the claw 320 to be moved back. The amount or distance of returning of the tape 146 is so small that no problem occurs.

Each time the EC carrier tape 148 is fed forward by one pitch, the cover tape 146 is peeled by one pitch from the EC accommodating tape 140, and is fed to the tape collecting box 184 while being supported on the conveyor belts 290, 291. Eventually the peeled cover tape 146 enters the opening 364 of the box 184. In the box 184, the tape 146 is further moved on the belts 290, 291, and is moved in an oblique direction away from the belts 290, 291 by the flanges 297 of the pulley 295 that project upward over the belts 290, 291, so that the tape 146 is introduced onto the guide surface 374 of the box 184.

Since the front end of the guide surface 374, i.e., the upstream-side end of the same 374 as viewed in the cover-tape-feed direction is positioned at a level lower than that of the top portions of the flanges 297, the tape 146 can be surely introduced from the belts 290, 291 onto the guide surface 374 of the box 184 via the flanges 297. The guide surface 374 functions for introducing, into the box 184, not only the end portion of the tape 146 but also the entire length of the tape 146. Therefore, the tape 146 can be smoothly fed with the belts 290, 291 and be prevented from being caught in the space between the outer surface of the bottom wall 361 of the box 184 and the belts 290, 291. The level of the front end portion of the guide surface 374 is lower than that of the top portions of the flanges 297 but that difference is small. Therefore, the tape 146 does not follow the belts 290, 291. In addition, since the two portions of the guide surface 374 that correspond to the two belts 290, 291 extend into the two spaces defined by the three flanges 297, i.e., reach the vicinities of the belts 290, 291, the tape 146 can be easily and surely introduced onto the guide surface 374.

Each time the cover tape 146 is peeled by one pitch, the conveyor belts 290, 291 are moved relative to the tape collecting box 184, so that the tape 146 is surely moved toward the guide surface 374 of the box 184. In addition, the tape 146 receives a force applied thereto in a direction in which the tape 146 is crammed into the box 184. Thus, a great amount of cover tape 146 can be reliably collected in the box 184.

Figure 18C:
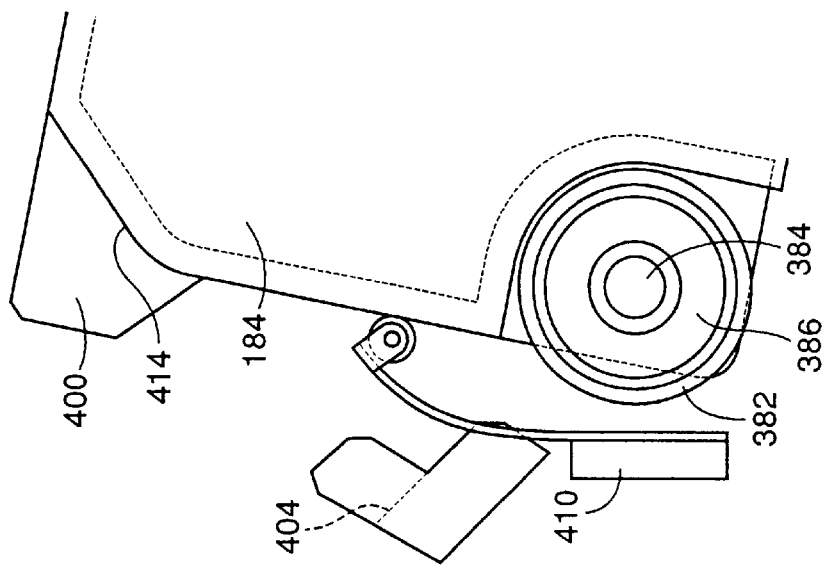
FIG. 18C is a view showing still another step of the tape-collecting-box pivoting operation.
Figure 18B:
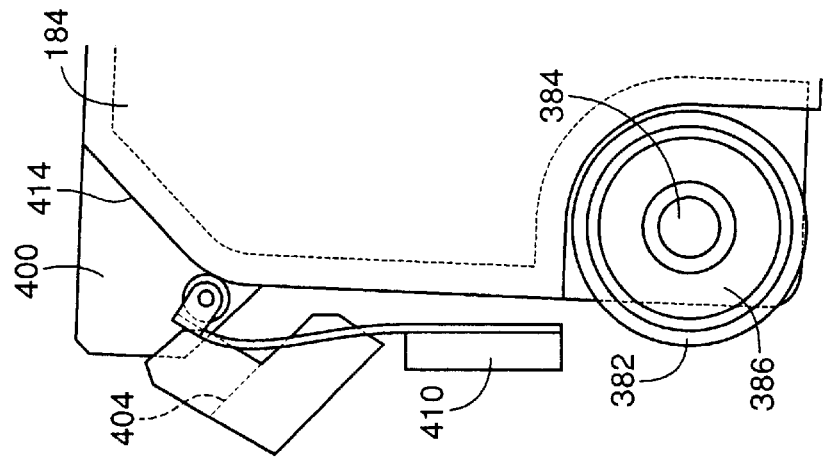
FIG. 18B is a view showing another step of the tape-collecting-box pivoting operation.
Figure 18A:
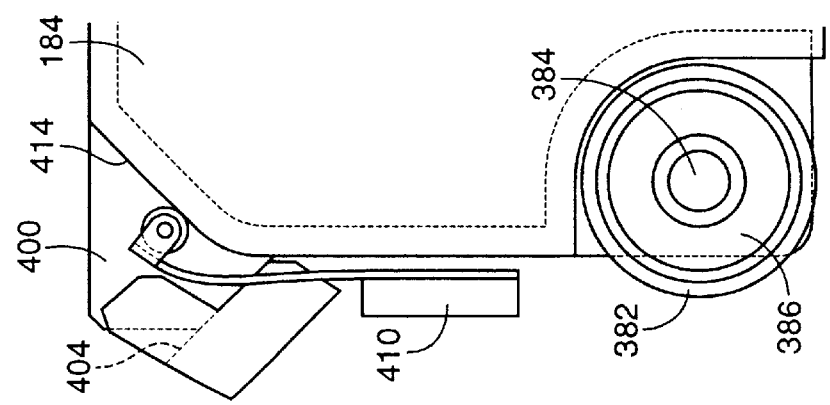
FIG. 18A is a view showing one step of a tape-collecting-box pivoting operation performed by an operator.

When the tape collecting box 184 is filled with the cover tape 146, the operator grasps the projection 400 and pivots the box-forming member 358 about the axis member 360. The moving-up preventing member 410 is deformed, as illustrated in FIG. 18B, to allow the pivotal motion of the member 358. In the state in which the member 358 has been pivoted to its tape-remove position, illustrated in two-dot chain lines in FIG. 2, where the lengthwise direction of the member 358 is perpendicular to the cover-tape-feed direction, the front portion of the member 358 is not covered by the bracket 104, i.e., is opened laterally. Thus, the operator can easily remove the tape 146 out of the box 184.

After the operator has taken the cover tape 146 out of the tape collecting box 184, he or she pivots the box-forming member 358 to its tape-collect position. At the beginning, the roller 412 of the moving-up preventing member 410 is positioned within the range in which the member 358 is moved between its tape-remove and tape-collect positions, as illustrated in FIG. 18C. As the box-forming member 358 is pivoted toward its tape-collect position, the preventing member 410 is elastically deformed as illustrated in FIG. 18B and eventually is engaged with the engaging surface 414. In the state in which the box 184 has been pivoted to its tape-collect position, the roller 412 is engaged with the engaging surface 414 and the roller 382 is pressed on the cover tape 146 and the conveyor belt 291 owing to the force produced by the effect of the inclination of the surface 414. The moving-up preventing member 410 contacts the box-forming member 358 via the roller 412, and the roller 412 rotates to allow the member 358 to pivot to its tape-collect position. Thus, the operator can smoothly pivot the member 358 with the least friction produced between the two members 358, 410.

As is apparent from the foregoing description, in the illustrated embodiment, the portion of the bottom wall 361 of the tape collecting box 184 that defines the guide surface 374 provides a guide device which moves up the cover tape 146 supported and conveyed on the portions of the conveyor belts 290, 291, and introduces the tape 146 from those portions of the belts 290, 291 into the box 184 via the opening 364. A portion of the control device 440 that starts and stops the DC motor 246 provides a drive-source control device.

In addition, the roller (cam follower) 230, the plate cam 234, the lever 224, and the link 308 cooperate with the DC motor 246 as an electric rotary motor as an example of a drive source, to provide a lever drive device as a reciprocative-member drive device. The cover-tape feeding device 182 and the carrier-tape feeding device 180 share the drive source 246, the cam 234, and the cam follower 230, and the arm portion 312 of the lever 224 cooperate with the link 308 to provide a synchronizing device which reciprocates the lever 292 in synchronism with the carrier-tape feeding operation of the carrier-tape feeding device 180. The foregoing description can basically apply to the other EC feeder 92 of the pair of EC feeders 92 shown in FIG. 5. However, the link 420 and the lever 424 are additionally employed to provide the lever drive device of the other EC feeder 92, and the link 426, the portion of the lever 422 that is connected to the link 426, and the link 428 cooperate with one another to provide the reciprocating device of the other EC feeder 92.

In the first embodiment shown in FIGS. 1 to 18, the operative portion 324 of the pinching member 320 extends on the upstream side of the straight line connecting between the center of pivotal motion of the lever 292 and the center of pivotal motion of the member 320, as viewed in the cover-tape-feed direction. However, FIGS. 19A and 19B show a pinching member 470 including an operative portion 472 which extends on the downstream side of the straight line in the cover-tape-feed direction. A lever 474 is pivotally attached, at one end portion thereof, to a bracket 104 via an axis member 476, and is pivotally connected, at the other end portion thereof, to a link 478. The pinching member 470 is attached to a lengthwise intermediate portion of the lever 474 via an axis member 480, such that the member 470 is pivotable about an axis line of the axis member 480. The operative portion 472 extends on the downstream side of the straight line connecting between the center of pivotal motion of the lever 474 and the center of pivotal motion of the member 470, as viewed in the cover-tape-feed direction.

When the lever 474 is pivoted in its backward direction, the operative portion 472 is moved in a direction toward the cover tape 146; and when the lever 474 is pivoted in its forward direction, the operative portion 472 is forced to engage the cover tape 146 and the conveyor belt 291. A spring member 482 as an example of a biasing device that is provided between the lever 474 and the member 470, biases the member 470 in a direction in which the operative portion 472 is brought into contact with the tape 146 and the belt 291.

When the lever 474 is pivoted in its forward direction (i.e., counterclockwise in FIG. 19A) to feed the cover tape 146, the tape 146 is fed while being pinched between the operative portion 472 and the belts 290, 291 like in the first embodiment. In particular, since the operative portion 472 is forced to engage the tape 146 and the belts 290, 291, great frictional forces are produced between the operative portion 472 and the tape 146 and between the portion 472 and the belts 290, 291. Thus, the tape 146 is easily fed forward.

Since the pinching member 470 is provided on the pivotable lever 474, the axis of pivotal motion of the member 470 describes a part cylindrical surface as the lever 474 is pivoted. Thus, the operative portion 472 is forced to engage the cover tape 146. Since the pinching member 470 is forced to engage the cover tape 146 when the lever 474 is pivoted forward, the member 470 can feed slightly greater lengths of the tape 146 and belts 290, 291 as compared with the case where the operative portion 472 held in contact with the tape 146 and the belts 290, 291 slides with the tape 146 and the belts 290, 291 relative to the belt guide 298 in a direction parallel to the guide 298. However, after the lever 474 moves over the perpendicular line from the axis of pivotal motion of the lever 474 onto the belt guide 298, the pinching member 470 can feed only smaller lengths of the tape 146 and the belts 290, 291. In total, the member 470 can feed the same length of the cover tape 146 as that fed in the case where the tape 146 would be fed from the feed-start position to the feed-end position in a direction parallel to the guide 298.

When the lever 474 is pivoted back, the operative portion 472 of the pinching member 470 is not forced to engage the cover tape 146, the operative portion 472 is moved back while sliding on the tape 146, as shown in FIG. 19B. Thus, the portion 472 does not return the tape 146. That is, though the axis of pivotal motion of the pinching member 470 describes a part cylindrical surface as the lever 474 is pivoted back, the member 470 is pivoted relative to the lever 474 in a direction in which the portion 472 is not forced to engage the tape 146.

FIGS. 20A and 20B show a pinching member 502 which can be moved away from a cover tape 146 by a solenoid 500. One end portion of a lever 504 is attached to a bracket 104 via an axis member 506 such that the lever 504 is pivotable about the axis member 506, and the other end portion of the lever 504 is pivotally connected to a link (not shown). The pinching member 502 is attached to a lengthwise intermediate portion of the lever 504 via an axis member 508 such that the member 502 is pivotable about the axis member 508. A spring member 510 as an elastic member as an example of a biasing device is provided between the pinching member 502 and the lever 504, and biases an operative portion 512 of the lever 504 in a direction in which the operative portion 512 is brought into contact with the cover tape 146. The operative portion 512 of the lever 504 projects on the upstream side of the straight line passing through the respective axis lines of the axis members 506, 508 as viewed in the cover-tape-feed direction in which the cover tape 146 is fed forward.

The lever 504 has an engaging surface 516 formed in one end portion thereof opposite to the other end portion thereof functioning as the operative portion 512. The engaging surface 516 is formed in a downstream half portion of the one end portion of the lever 504 as viewed in a direction in which the spring member 510 biases and pivots the pinching member 502. The engaging surface 516 is inclined such that as the distance of the surface 516 from the axis of pivotal motion of the pinching member 502 increases, the width of the one end portion of the member 502 decreases.

The solenoid 500 is attached to a portion of the lever 504 that is nearer to the axis member 506 than to the axis member 508. When the solenoid 500 is energized and deenergized, a plunger 520 is moved to its retracted position (i.e., its inoperative position) where the plunger 520 is away from the engaging surface 516, and to its extended position (i.e., its operative position) where the plunger 520 engages the engaging surface 516 and pivots the pinching member 502 against the biasing force of the spring member 510, respectively. Therefore, when the solenoid 500 is energized and the plunger 520 is moved to its extended position, the pinching member 502 is pivoted against the biasing force of the spring member 510; and when the solenoid 500 is deenergized and the plunger 520 is moved to its retracted position, the pinching member 502 is pivoted by the biasing force of the spring member 510 so as to contact the cover tape 146. In the present embodiment, the solenoid 500 and the engaging surface 516 cooperate with each other to provide a keeping-away device 522.

FIG. 20A shows the state in which the cover-tape feeding operation starts, that is, the state in which the solenoid 500 is deenergized, the plunger 520 is held at its retracted position, and the operative portion 512 is held in contact with the cover tape 146 by the biasing force of the spring member 510. When the lever 504 is pivoted in its forward direction, the pinching member 502 cooperates with a belt guide 298 to pinch and feed the cover tape 146 and conveyor belts 290, 291. The feeding of the cover tape 146 is carried out in synchronism with the feeding of the EC carrier tape 148, and in the state in which the lever 504 has been pivoted forward to the end, a roller 230 is engaged with a position-keep surface 254 of a cam surface 236 of a plate cam 234 and an origin-position sensor 276 detects an origin position of the plate cam 234. Thus, a control device 440 recognizes that the lever 504 has reached the end, and energizes the solenoid 500 to move the plunger 520 to its extended position. In the present embodiment, a rotatable plate 274 and the origin-position sensor 276 cooperate with each other to provide a forward-movement-end detecting device.

When the plunger 520 is moved to its extended position, the plunger 520 engages the engaging surface 516 and pivots the pinching member 502 against the biasing force of the spring member 510, so that the operative portion 512 is moved away from the cover tape 146, as shown in FIG. 20B. While the lever 504 is pivoted backward, the operative portion 512 of the pinching member 502 is kept away from the cover tape 146. Thus, the cover tape 146 is prevented from being moved back. In the state in which the lever 504 has been moved back to the end, that is, the feed-start position, the roller 230 is engaged with a portion of the cam surface 236 that is opposite to the position-keep surface 254 and has a constant distance from the center of rotation of the plate cam 234. The rotatable plate 274 has a through-hole at a position which corresponds to the origin-position sensor 276 when the cam surface 234 takes an angular phase where the roller 230 is engaged with the above-indicated portion of the surface 236. Thus, the origin-position sensor 276 detects that the lever 504 has reached the end of its backward movement. In the present embodiment, the rotatable plate 274 and the sensor 276 cooperate with each other to provide a backward-movement-end detecting device. When the solenoid 500 is deenergized and the plunger 520 is moved to its retracted position away from the engaging surface 516, the operative portion 512 of the pinching member 502 is brought into contact with the cover tape 146 by the biasing force of the spring member 510. When the lever 504 is moved forward, the cover tape 146 is fed forward.

In the case where the state in which a reciprocative member such as the lever 504 has reached the end of its forward movement can be detected by a detecting device such as the elements 274, 276, an actuator such as the solenoid 500 may be operated when the detecting device detects that state, so that an operative member such as the plunger 520 may be moved away from the pinching member 502. A detecting device such as a proximity switch, a limit switch, or a photoelectric sensor may be employed to detect that the reciprocative member such as the lever 504 has reached a position in the vicinity of the end of its forward movement or that the reciprocative member has reached a position in the vicinity of the end of its backward movement. In the latter case, the actuator may be operated based on the detection signal generated by the detecting device, so that the operative member may be engaged with, and disengaged from, the pinching member 502.

Figure 21:
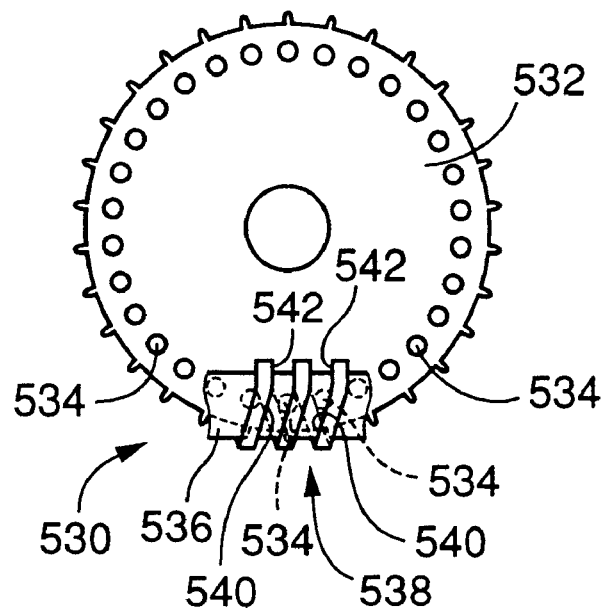
FIG. 21 is a schematic front elevation view of a barrel cam mechanism as an element of another EC feeder as a fourth embodiment of the present invention.
Figure 22:
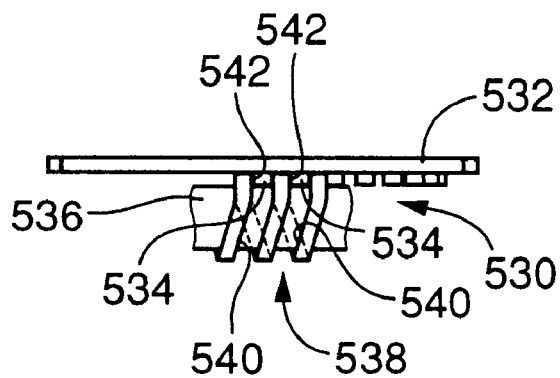
FIG. 22 is a schematic plan view of the barrel cam mechanism of FIG. 21.

In each of the illustrated embodiments, the rotation of the DC motor 246 is transmitted to the sprocket 192 via the plate cam 234 and the roller 230. On the other hand, FIGS. 21 and 22 show a barrel-cam mechanism 530 which transmits the rotation of a DC motor 246 to a sprocket 532 which is rotatably attached to a support member (not shown) as a constituent element of a common portion 100. The sprocket 532 has a plurality of pins 534 which are provided on a circle whose center rides on the axis of rotation of the sprocket 532 and which are equiangularly spaced from one another about that axis. This means that a pin wheel as an element of the barrel-cam mechanism 530 is provided as an integral portion of the sprocket 532.

The barrel-cam mechanism 530 includes a barrel cam 536 which is rotatable about a first axis line which is distant from a second axis line about which the sprocket 532 is rotatable, such that the first axis line is perpendicular to the second axis line as viewed in a vertical direction in FIG. 21. A cam groove 538 of the barrel cam 536 includes inclined portions 540 each of which is inclined with respect to a plane perpendicular to the axis of rotation of the barrel cam 536; and parallel portions 542 each of which is parallel to the plane. While the pins 534 are engaged with the parallel portions 542, the sprocket 532 is not rotated as the barrel cam 536 is rotated; and while the pins 534 are engaged with the inclined portions 540, the sprocket 532 is rotated as the barrel cam 536 is rotated, so that an EC carrier tape 148 is fed. Each of the inclined portions 540 is so formed that the EC carrier tape 148 is smoothly accelerated from the speed of zero and is smoothly decelerated to the speed of zero. The cam groove 538 is machined so accurately that the pins 534 are accurately engaged with the groove 538 with negligibly small backlash.

In the state in which a DC motor (not shown) is not operated, the pins 534 are engaged with the parallel portions 542. When the DC motor is started, the barrel cam 536 is rotated. After the cam 536 is brought into a state in which the cam 536 is rotated at a constant speed, the pins 534 enter the inclined portions 540, so that the sprocket 532 is rotated and the EC carrier tape 148 is fed forward. As the sprocket 532 is rotated, the pins 534 are sequentially engaged with the cam groove 538.

The plurality of pins 534 may be replaced with a plurality of rollers, or a plurality of pairs of rollers. In the last case, backlash can be prevented. For example, a ridge or rib which defines the cam groove 538 may be pinched by each pair of rollers which are subject to a preload. Alternatively, each pair of rollers which are subject to a preload may be engaged with a pair of side surfaces of the cam groove 538, respectively. In either case, the backlash is prevented. In particular, in the latter case, it is preferred that two pairs of rollers be simultaneously engaged with the cam groove 538.

Figure 23:
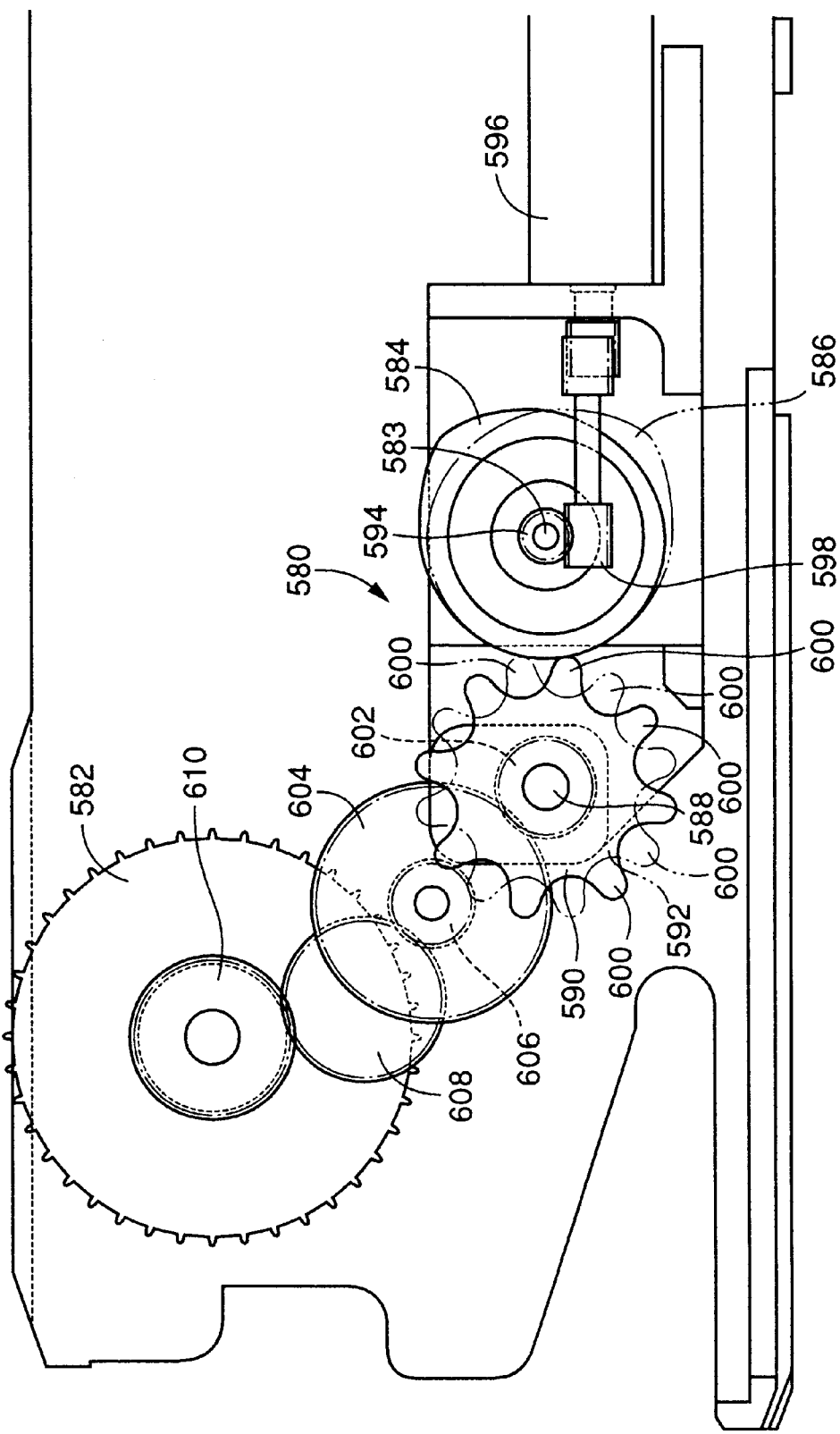
FIG. 23 is a schematic front elevation view of a parallel cam mechanism as an element of yet another EC feeder as a fifth embodiment of the present invention.

FIG. 23 shows a parallel-cam mechanism 580 which transmits the rotation of a DC motor 596 to a sprocket 582. The parallel-cam mechanism 580 includes two plate cams 584, 586 each of which is attached to an axis member 583 such that each plate cam 584, 586 is not rotatable relative to the axis member 583; and two driven wheels 590, 592 each of which is attached to an axis member 588 such that each driven wheel 590, 592 is not rotatable relative to the axis member 588 and accordingly the two driven wheels 590, 592 are not rotatable relative to each other. One of the two plate cams 584, 586 and one of the two drive wheels 590, 592 are illustrated in two-dot chain lines for being distinguished from the other cam and wheel, respectively, in FIG. 23. A worm wheel 594 is attached to the axis member 583 such that the worm wheel 594 is not rotatable relative to the axis member 583. The worm wheel 594 is meshed with a worm 598 which is rotated by the DC motor 596. Each of the driven wheels 590, 592 has eight projections 600 which project radially outwardly and which are equiangularly spaced from one another about the axis line of the axis member 588. The two driven wheels 590, 592 are offset from each other by half the angular pitch at which the projections 600 are spaced from one another about the axis line of the axis member 588. Since in the present embodiment the angular pitch is 45 degrees, half the angular pitch is 22.5 degrees. The rotation of the driven wheels 590, 592 is transmitted to the sprocket 582 via wheels 602, 604, 606, 608, 610.

When the DC motor 596 is started, the plate cams 584, 586 are rotated via the worm 598 and the worm wheel 594, so that the two driven wheels 590, 592 are alternately rotated and so that an EC carrier tape 148 is smoothly accelerated from the speed of zero and is smoothly decelerated to the speed of zero. Thus, the tape 148 is started and stopped with the least vibration. When one plate cam 584 presses and rotates the corresponding driven wheel 590, the projections 600 of the other driven wheel 592 engage the cam surface of the other plate cam 586, thereby preventing the driven wheel 590 from being freely rotated. When the other plate cam 586 presses and rotates the corresponding driven wheel 592, the projections 600 of the one driven wheel 590 engage the cam surface of the one plate cam 584, thereby preventing the driven wheel 592 from being freely rotated. Thus, the plate cams 584, 586 function as a positive motion cam.

Figure 24:
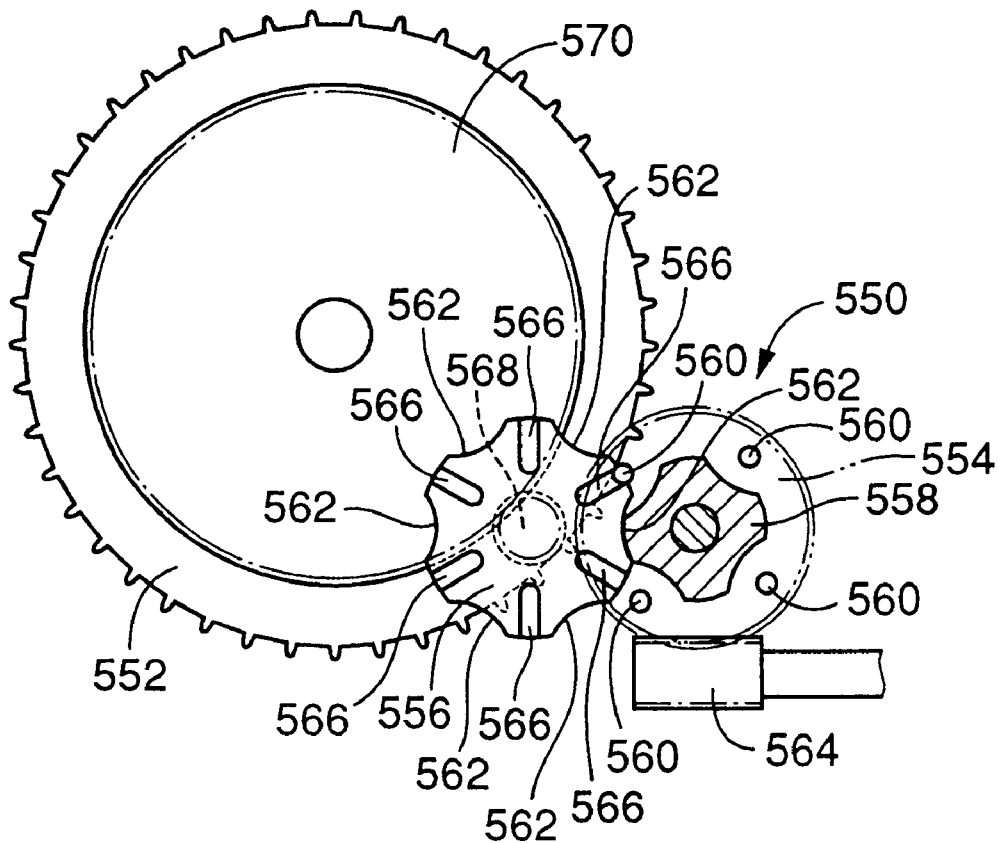
FIG. 24 is a schematic front elevation view of a Geneva mechanism as an element of another EC feeder as a sixth embodiment of the present invention.

FIG. 24 shows a Geneva mechanism 550 which transmits the rotation of a DC motor 246 to a sprocket 552. The Geneva mechanism 550 includes a drive wheel 554 which is rotatable about an axis line parallel to an axis line about which the sprocket 552 is rotatable; and a driven wheel 556. The drive wheel 554 has four pins 560 which are equiangularly spaced from each other about the axis line of the wheel 554; and a locking disc 558 which is not rotatable relative to the wheel 554. The drive wheel 554 has a number of teeth on its outer circumferential surface thereof, and functions as a worm wheel which is meshed with a worm 564.

The driven wheel 556 has six radial grooves 566 which are equiangularly spaced from one other; and six arcuate surfaces 562 each of which is provided between a corresponding pair of adjacent radial grooves 566. The driven wheel 556 is provided with a wheel 568 which is coaxial with the wheel 556 and is not rotatable relative to the same 556. The wheel 568 is meshed with a wheel 570 which is coaxial with the sprocket 552 and is not rotatable relative to the same 552.

When the DC motor 246 is started, the drive wheel 554 is rotated via the worm 564. Each pin 560 enters and engages one radial groove 566, so that the rotation of the drive wheel 554 is transmitted to the driven wheel 556. Thus, the sprocket 552 is rotated via the wheels 566, 568, so that an EC carrier tape 148 is smoothly accelerated from the speed of zero and is smoothly decelerated to the speed of zero. When the each pin 560 comes out of the one radial groove 566, the tape 148 is stopped. The locking disc 558 can be engaged with each of the arcuate surfaces 562, so that the driven wheel 556 is prevented from being rotated while the drive wheel 554 is rotated. During this state, the DC motor 246 is stopped by the control device 440.

The cover tape 146 peeled from the EC accommodating tape 140 may not be collected by the cover-tape collecting box 184, but may be treated in any suitable manner. For example, the cover tape 146 peeled from the accommodating tape 140 may be just accumulated on the support table 90, or the floor, may be taken up by a cover-tape take-up device, or may be cut into small pieces by a cutting device and then sucked by a suction device. The cover-tape take-up device may be one which includes a take-up reel and a reel drive device and which peels and takes up the cover tape 146, or may be one which only takes up the cover tape 146. In the last case, it is possible to employ additionally a cover-tape feeding device which may be the cover-tape feeding device 182, shown in FIGS. 1 to 18, which, however, does not include the tape collecting box 184, or which may be one provided by at least one pair of feed rollers. In any case, the cover-tape take-up device and the carrier-tape feeding device 180 may share a common drive source, so that the cover-tape taking-up operation may be performed in synchronism with the carrier-tape feeding operation. Otherwise, the cover-tape take-up device may be one which includes an exclusive drive source and which performs the cover-tape taking-up operation may in synchronism, or asynchronism, with the carrier-tape feeding operation.

In each of the illustrated embodiments, the cover-tape collecting box 184 includes, in addition to the box-forming member 358, a portion of the bracket 104. However, the collecting box 184 may be replaced with one which is provided without utilizing any portion of the common portion or main frame 100. This collecting box can be attached to, and detached from, the main frame 100, in the state in which the cover tape 146 is stored in a tape collecting chamber of the box. Therefore, when the box is filled with the tape 146, the operator may take the tape 146 out of the box in the state in which the box remains attached to the main frame 100, or may replace the full box with an empty box. In the former case, the box is further used. In the latter case, the operator takes the tape out of the full box, at a place away from the EC feeder 92.

Each EC feeder 92 can feed different sorts of EC carrier tapes 148 carrying different sorts of ECs 78 having different dimensions. The different EC carrier tapes 148 may include different EC accommodating tapes 140 having different accommodating-pocket pitches. In this case, each EC feeder 92 may feed the ECs 78, one by one, to the EC-pick-up position, by feeding each EC carrier tape 148 at a feed pitch equal to a quotient obtained by dividing the accommodating-pocket pitch by an integral number which may be one, two, three, etc. In the case where the integral number is one, the lever ratio of the lever 224 which transmits the rotation of the plate cam 234 to the pivotable plate 200 may be so determined as to feed each EC 78 to the EC-pick-up position by one cover-tape feeding operation of the cover-tape feeding device 182.

In each of the illustrated embodiments, each EC feeder 92 waits for one EC sucker 76 to pick up one EC 78, in the state in which the feeder 92 has just finished its preparation for performing the next carrier-tape feeding operation. However, each EC may be adapted to do in the state in which the feeder 92 has just positioned one EC 78 at the EC-pick-up position in one carrier-tape feeding operation. In the latter case, the feeder 92 prepares for the next carrier-tape feeding operation, after the EC sucker 76 has picked up the EC 78.

In each of the illustrated embodiments, the feeder support table 90 is a stationary or immovable member. However, the immovable support table 90 may be replaced with a movable support table. The movable table may be one which is moved by a table moving device in a direction parallel to a straight or curved line along which respective EC-supply portions of the EC feeders 92, around the respective EC-pick-up positions thereof, are arranged. As the movable table is moved, the EC-supply portions are sequentially moved to, and positioned at, an EC-supply position where each EC 78 is supplied to each EC sucker 76. In the case where the EC feeder 92 is provided with a drive source such as an electric rotary motor, the feeder 92 is permitted to feed the EC carrier tape 148 for a comparatively long time while the movable table is moved. There is a timing when the leading EC 78 is not covered with the cover tape 146 or the cover member 160. However, the EC carrier tape 148 is fed in such a manner that at a timing around when the movable table is stopped and the EC-supply portion of one EC feeder 92 is positioned at the EC-supply position, the leading EC 78 comes out of the cover member 160 and reaches the EC-pick-up position. Thus, the leading EC 78 is prevented from jumping out of the EC-accommodating pocket 144 because of the vibration produced by the starting and stopping of movement of the movable table. In each of the illustrated embodiments, the cover-tape feeding device 182 and the carrier-tape feeding device 180 cooperate with other elements to provide one EC feeder unit 92. However, the principle of the present invention may be applied to the case where a plurality of individual cover-tape feeding devices and a plurality of individual carrier-tape feeding devices are directly attached to, and detached from, a support table which functions as a common or main frame. In this case, the individual cover-tape feeding devices, the individual carrier-tape feeding devices, and the support table cooperate with one another to provide a plurality of EC feeders, and the support table may be a movable one which is moved by a table moving device such that respective EC-supply portions of the EC feeders are sequentially positioned at an EC-supply position where each feeder supplies one or more ECs.

In the case where the respective EC-supply portions of the EC feeders 92 are sequentially moved to, and positioned at, the EC-supply position, as indicated above, the EC transferring and mounting apparatuses 20, 22, shown in FIG. 1, wherein the intermittent-rotation body 68, 70 carrying the plurality of EC suckers or holders 76 is moved by the X-Y robot 62, 64 as the moving device, may be replaced with various suitable EC mounting devices. For example, the previously-identified Japanese patent document No. 7-9381 discloses an example of those EC mounting devices that includes an intermittent-rotation body and a plurality of EC suckers as a plurality of EC holders and which intermittently rotates the body to move sequentially an EC-take-up position and an EC-mount position. In addition, Japanese Patent Application laid open for public inspection under Publication No. 9-237997 discloses another example of those EC mounting devices that includes a plurality of rotary members which are rotatable about a common axis line, independently of each other; a rotary-motion applying device which applies, to each of the rotary members, a rotary motion which assures that each rotary member is rotated by 360 degrees about the common axis line, is stopped at least one time during the 360-degree rotation, and continues to have a predetermined time difference from each of its preceding and following rotary members; and a plurality of EC holders which are carried by the plurality of rotary members, respectively.

It is not essentially required that each EC feeder 92 (or its main frame 100) be provided with a carrier-tape storing device which stores the EC carrier tape 148. The carrier-tape storing device may be provided separately from the main frame 100.

It is to be understood that the present invention may be embodied with other changes, improvements, and modifications that may occur to those skilled in the art without departing from the scope and spirit of the invention defined in the appended claims.

What is claimed is:

1. An electric-component feeder for feeding a carrier tape carrying a plurality of electric components at a predetermined component-carry pitch, at a tape-feed pitch equal to a quotient obtained by dividing the component-carry pitch by an integral number, and thereby supplying the electric components, one by one, the feeder comprising:

a main frame including a tape guide which guides the carrier tape in a lengthwise direction thereof;

a cam which has a cam surface and which is provided on the main frame such that the cam surface is movable relative to the main frame;

a cam drive device which is supported by the main frame and which drives the cam and thereby moves the cam surface relative to the main frame;

a cam follower which is supported by the main frame and which follows the cam surface while the cam surface is moved by the cam drive device;

a motion converting device which is supported by the main frame and which converts the motion of the cam follower into the feeding of the carrier tape at the tape-feed pitch along the tape guide of the main frame; and the cam surface comprising at least a decelerating portion which decelerates the cam follower so as to decelerate the carrier tape smoothly to zero, while the cam is driven by the cam drive device at a predetermined speed.

2. A feeder according to claim 1, wherein the cam drive device comprises a drive source which is provided on the main frame and which drives the cam.

3. A feeder according to claim 2, wherein the cam surface comprises a predetermined-position keeping portion which does not move, while the cam is driven by the cam drive device, the cam follower and thereby keeps the cam follower at a predetermined position, and wherein the cam drive device comprises a drive-source control device which stops the drive source from driving the cam, in a state in which the cam follower is engaged with the predetermined-position keeping portion of the cam surface.

4. A feeder according to claim 2, wherein the cam surface further comprises an accelerating portion which accelerates the cam follower so as to accelerate the carrier tape smoothly from zero, while the cam is driven by the cam drive device at the predetermined speed.

5. A feeder according to claim 1, wherein the cam comprises a rotary cam which is rotatable about an axis line.

6. A feeder according to claim 5, wherein the cam drive device comprises a drive source which is provided on the main frame and which drives the cam, and wherein the drive source comprises an electric rotary motor which is not controllable with respect to a rotation angle thereof.

7. A feeder according to claim 6, wherein the electric rotary motor comprises a direct-current motor.

8. A feeder according to claim 6, wherein the cam drive device further comprises a speed reducing device which transmits a rotation of the electric rotary motor to the cam while reducing a speed of the rotation.

9. A feeder according to claim 8, wherein the speed reducing device comprises a worm and a worm wheel.

10. An electric-component feeder according to claim 1, wherein the carrier tape has a plurality of tape-feed holes at a predetermined feed-hole pitch in a lengthwise direction thereof, and wherein the motion converting device comprises:
   a sprocket which is rotatable about an axis line and which has a plurality of engaging projections at least one of which is engaged with at least one of the tape-feed holes of the carrier tape both when the tape is being fed and when the tape is not being fed;
   a ratchet wheel which has a plurality of teeth and which is rotatable about the axis line together with the sprocket;
   a ratchet pawl which is engageable with at least one of the teeth of the ratchet wheel; and
   a pivotable member which supports the ratchet pawl and which is pivotable about the axis line by the motion of the cam follower so as to move the ratchet pawl, thereby rotate the ratchet wheel and the sprocket together, and thereby feed the carrier tape at the tape-feed pitch.

11. A feeder according to claim 10, further comprising a stopper which engages the teeth of the ratchet wheel and thereby stops the rotation of the ratchet wheel, the stopper permitting the ratchet wheel to be rotated in a first direction to feed the carrier tape, and inhibiting the ratchet wheel from being rotated in a second direction opposite to the first direction.

12. An electric-component feeder according to claim 1, wherein the carrier tape comprises an accommodating tape having, at the predetermined component-carry pitch, a plurality of accommodating pockets which accommodate the plurality of electric components, respectively; and a cover tape which is attached to the accommodating tape to close the accommodating pockets, and wherein the feeder further comprises:
   a cover-tape feeding device which feeds a portion of the cover tape that is peeled from the accommodating tape;
   the cam drive device comprising a drive source which is provided on the main frame and which drives the cam; and
   the cover-tape feeding device comprising a drive source which is provided by the drive source of the cam drive device.

13. A feeder system comprising:
   a plurality of feeders each of which feeds a carrier tape carrying a plurality of electric components at a predetermined component-carry pitch, at a tape-feed pitch equal to a quotient obtained by dividing the component-carry pitch by an integral number, and thereby supplying the electric components, one by one, said each feeder comprising:
      a main frame including a tape guide which guides the carrier tape in a lengthwise direction thereof;
      a cam which has a cam surface and which is provided on the main frame such that the can surface is movable relative to the main frame;
      a cam drive device which is supported by the main frame and which drives the cam and thereby moves the cam surface relative to the main frame;
      a cam follower which is supported by the main frame and which follows the cam surface while the cam surface is moved by the cam drive device;
      a motion converting device which is supported by the main frame and which converts the motion of the cam follower into the feeding of the carrier tape at the tape-feed pitch along the tape guide of the main frame;
   the cam surface comprising at least a decelerating portion which decelerates the cam follower so as to decelerate the carrier tape smoothly to zero while the cam is driven by the cam drive device at a predetermined speed; and
   a support table to which each of the feeders is detachably attached.

14. An electric-component feeder for feeding a carrier tape carrying a plurality of electric components at a predetermined component-carry pitch, at a tape-feed pitch equal to a quotient obtained by dividing the component-carry pitch by an integral number, and thereby supplying the electric components, one by one, the feeder comprising:
   a main frame including a tape guide which guides the carrier tape in a lengthwise direction thereof;
   a Geneva mechanism which is supported by the main frame and which includes a drive wheel having at least one pin and a locking disc, and a driven wheel having a plurality of grooves and a plurality of arcuate surfaces, the driven wheel being rotated by a rotation of the drive wheel because of engagement of the pin with each of the radial grooves, and being not rotated during the rotation of the drive wheel because of engagement of the locking disc with each of the arcuate surfaces;
   a drive device which is supported by the main frame and which rotates the drive wheel of the Geneva mechanism; and
   a motion converting device which is supported by the main frame and which converts the rotation of the driven wheel into the feeding of the carrier tape at the tape-feed pitch along the tape guide of the main frame.

15. An electric-component feeder for feeding a carrier tape carrying a plurality of electric components at a predetermined component-carry pitch, at a tape-feed pitch equal to a quotient obtained by dividing the component-carry pitch by an integral number, and thereby supplying the electric components, one by one, the feeder comprising:
   a main frame including a tape guide which guides the carrier tape in a lengthwise direction thereof;
   a barrel-cam mechanism which is supported by the main frame and which includes (a) a cam-follower wheel which is rotatable about a first axis line and has a plurality of cam followers which are provided along a circle whose center rides on the first axis line and which are equiangularly spaced from each other about the first axis line, and (b) a barrel cam which is rotatable about a second axis line which extends on a first plane perpendicular to the first axis line and is distant from the first axis line, the barrel cam having a cam groove including a plurality of inclined portions each of which is inclined with respect to a second plane perpendicular to the second axis line, and at least one parallel portion which is parallel to the second plane, the cam-follower wheel being rotated by a rotation of the barrel cam because of engagement of each one of the inclined portions of the cam groove of the barrel cam with each one of the cam followers, and being not rotated during the rotation of the barrel cam because of engagement of the parallel portion of the cam groove with said each one cam follower;

a drive device which is supported by the main frame and which rotates the barrel cam; and a motion converting device which is supported by the main frame and which converts the rotation of the cam-follower wheel into the feeding of the carrier tape at the tape-feed pitch along the tape guide of the main frame.

16. An electric-component feeder for feeding a carrier tape carrying a plurality of electric components at a predetermined component-carry pitch, at a tape-feed pitch equal to a quotient obtained by dividing the component-carry pitch by an integral number, and thereby supplying the electric components, one by one, the feeder comprising:

a main frame including a tape guide which guides the carrier tape in a lengthwise direction thereof;

a parallel-cam mechanism which is supported by the main frame and which includes (a) two rotary cams each of which has a cam surface including a first portion and a second portion and which are rotatable about a first axis line such that the two rotary cams are not rotatable relative to each other, and (b) two cam-follower wheels which are rotatable about a second axis line such that the two cam-follower wheels are not rotatable relative to each other, the respective first portions of the respective cam surfaces of the two rotary cams being angularly offset from each other, each of the two cam-follower wheels having a plurality of cam followers which are provided along a circle whose center rides on the second axis line and which are equiangularly spaced from each other about the second axis line at a predetermined angular pitch, the cam followers of one of the two cam-follower wheels being angularly offset from the corresponding cam followers of the other cam-follower wheel by an angle equal to half the predetermined angular pitch, the two cam-follower wheels being rotated by a rotation of the two rotary cams because of engagement of the first portion of the cam surface of each one of the two rotary cams with each one of the cam followers of a corresponding one of the two cam-follower wheels, and being not rotated during the rotation of the two rotary cams because of engagement of the respective second portions of the respective cam surfaces of the two rotary cams with respective cam followers of the two cam-follower wheels;

a drive device which is supported by the main frame and which rotates the two rotary cams; and a motion converting device which is supported by the main frame and which converts the rotation of the two cam-follower wheels into the feeding of the carrier tape at the tape-feed pitch along the tape guide of the main frame.

* * * * *